US012772771B2

(12) United States Patent
Sarile, Jr. et al.

(10) Patent No.: US 12,772,771 B2
(45) Date of Patent: Oct. 20, 2026

(54) WAFER ADAPTORS, INCLUDING SYSTEMS AND METHODS, FOR ADAPTING DIFFERENT SIZED WAFERS

(71) Applicant: UTAC Headquarters Pte. Ltd., Singapore (SG)

(72) Inventors: Enrique E. Sarile, Jr., Singapore (SG); Chee Kay Chow, Singapore (SG); Dzafir Bin Mohd Shariff, Singapore (SG)

(73) Assignee: UTAC Headquarters Pte. Ltd., Singapore (SG)

( * ) Notice: Subject to any disclaimer, the term of this patent is extended or adjusted under 35 U.S.C. 154(b) by 1056 days.

(21) Appl. No.: 17/722,416

(22) Filed: Apr. 18, 2022

(65) Prior Publication Data

US 2022/0336283 A1 Oct. 20, 2022

Related U.S. Application Data

(60) Provisional application No. 63/175,560, filed on Apr. 16, 2021, provisional application No. 63/175,571, filed on Apr. 16, 2021.

(51) Int. Cl.

| | |
|---|---|
| ***H10P 54/00*** | (2026.01) |
| ***B23Q 1/03*** | (2006.01) |
| ***H01J 37/32*** | (2006.01) |
| ***H10P 72/00*** | (2026.01) |
| ***H10P 72/70*** | (2026.01) |

(52) U.S. Cl.

CPC ................ *H10P 54/00* (2026.01); *B23Q 1/03* (2013.01); *H01J 37/32715* (2013.01); *H10P 72/0428* (2026.01); *H10P 72/7402* (2026.01)

(58) Field of Classification Search

None

See application file for complete search history.

(56) References Cited

U.S. PATENT DOCUMENTS 12,215,966 B2 * 2/2025 Waqar .................... G01B 11/24

* cited by examiner

*Primary Examiner* — Wael Fahmy

(74) *Attorney, Agent, or Firm* — HORIZON IP PTE. LTD

(57) ABSTRACT

A wafer adaptor ring assembly for adapting an adapted sized wafer for plasma dicing by a plasma etch chamber designed for dicing a designed sized wafer, which is larger than the adapted sized wafer is disclosed. The wafer adaptor ring assembly includes a primary wafer ring designed for plasma dicing the designed sized wafer by the plasma, an adhesive sheet attached to a bottom surface of the primary wafer ring, and an adapted sized wafer disposed on the adhesive sheet between the primary wafer ring and the adapted sized wafer. A system for assembling and disassembling the wafer adaptor ring assembly is also disclosed.

15 Claims, 41 Drawing Sheets

320

640

760

Top View

1500

1500

WAFER ADAPTORS, INCLUDING SYSTEMS AND METHODS, FOR ADAPTING DIFFERENT SIZED WAFERS

CROSS-REFERENCE TO RELATED APPLICATION

This application claims the benefit of U.S. Provisional Application Ser. No. 63/175,560, filed on Apr. 16, 2021, and U.S. Provisional Application Ser. No. 63/175,571, filed on Apr. 16, 2021. This application also cross-references to concurrently filed U.S. patent application Ser. No. 17/723,413, titled wafer adaptor for adapting different sized wafers. All applications are incorporated by reference in their entirety for all purposes.

FIELD OF THE INVENTION

The present disclosure generally relates to a plasma processing (etching) of semiconductor wafers. More specifically, the present disclosure is directed to wafer adaptors and systems for utilizing wafer adaptors for adapting different sized wafers for plasma processing, such as plasma dicing. The wafer adaptors and systems may be employed for other types of processing.

BACKGROUND

In semiconductor processing, a wafer is processed to form a plurality of devices thereon. After the devices are formed, the wafer is diced to separate the devices into individual dies. Conventional techniques for dicing employ the use of a dicing saw. The saw dices the wafer along x and y saw lines, one at a time, to separate the wafer into individual dies. Sawing, however, takes time, which slows down the processing throughput. In addition, sawing may cause cracks in the dies which may impact yields negatively.

To combat the issues of sawing, plasma dicing has been employed. Plasma dicing entails mounting a wafer onto a wafer ring and inserting the wafer ring with the wafer into a plasma chamber for etching. Unlike mechanical sawing, the plasma etch process singulates the wafer into individual dies in a single etch step. This significantly improves throughput. In addition, plasma dicing avoids vibration which may cause cracking in the dies.

However, plasma chambers are specifically designed to etch or process a wafer of a specific size. When other sized wafers are etched, new plasma chambers need to be purchased. Plasma chambers are very expensive, for example, in the range of millions of dollars per chamber. In addition, purchasing a plasma chamber requires a long lead time, which results in delays.

The present disclosure is directed to wafer adaptors which can be used to adapt a wafer ring to accommodate different sized wafers for plasma processing using the same plasma etch chamber. The wafer adaptors may be employed for other types of processing.

SUMMARY

Wafer adaptors, including systems and methods thereof, are disclosed. In one embodiment, a method for adapting a wafer for processing includes providing a primary wafer ring assembly. The primary wafer ring assembly includes a primary wafer ring having a primary ring opening. The primary ring opening is configured for dicing a wafer of a designated size (designated sized wafer). The primary wafer ring assembly also includes an adhesive sheet having a front laminated adhesive sheet surface laminated onto a back primary ring surface of the primary wafer ring. A wafer is laminated onto the front laminated adhesive sheet surface in the opening of the primary ring. A primary gap is between the wafer and the primary rings. The wafer (adapted sized wafer) has a diameter which is smaller than the designated sized wafer. The method also includes positioning an adaptor wafer ring by a position module of a system on the adhesive sheet of the primary ring assembly between the primary wafer ring and the adapted sized wafer to form an adapted wafer ring assembly to form a wafer adaptor ring assembly. The adaptor wafer ring of the adapted wafer ring assembly adapts the adapted sized wafer for processing in processes designed for processing of the designated sized wafer.

In another embodiment, a system for assembling a wafer adaptor ring assembly for processing of an adapted sized wafer in processes designed for processing a designed size wafer which is larger than the adapted sized wafer is disclosed. The system includes an input subsystem for providing input materials for assembling the wafer adaptor ring. The system also includes a processing subsystem for assembling the input material into the wafer adaptor ring assembly. The system further includes an output subsystem for outputting the wafer adaptor ring assembly for processing the adapted sized wafer.

In yet another embodiment, a wafer adaptor ring assembly for adapting an adapted sized wafer for processing in processes designed for processing a designed sized wafer which is larger than the adapted size wafer is disclosed. The ring assembly includes a primary ring having inner and outer primary ring edges. The outer primary ring edge defines a shape of the primary ring and the inner primary ring edge defines a primary ring opening. The primary ring is designed to accommodate the designed sized wafer within the primary ring opening. An adhesive sheet is attached to a bottom primary ring surface of the primary ring. The adhesive sheet provides a support surface within the primary ring opening. An adhesive surface of the adhesive sheet is facing the bottom primary ring surface. The adhesive sheet is configured to hold the adapted sized wafer. An adaptor ring is disposed on the adhesive sheet between the inner primary ring edge and the adapted sized wafer when attached to the adhesive sheet in the primary opening.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments relate to wafer adaptors and systems for utilizing wafer adaptors for adapting different sized wafers for plasma processing, such as plasma etching or dicing. Wafer adaptors result in significant cost savings by avoiding the need to have different plasma dicing tools configured for different sized wafers. It is to be understood that the wafer adaptors and systems for utilizing wafer adaptors for adapting different sized wafers described herein may also be applied in other processes, such as the processes after plasma dicing, including but not limited to tape cutting, Automated Optical Inspection (AOI), and Tape and Reel machines processes, which involve processing wafers on a wafer ring.

Figure 1A:
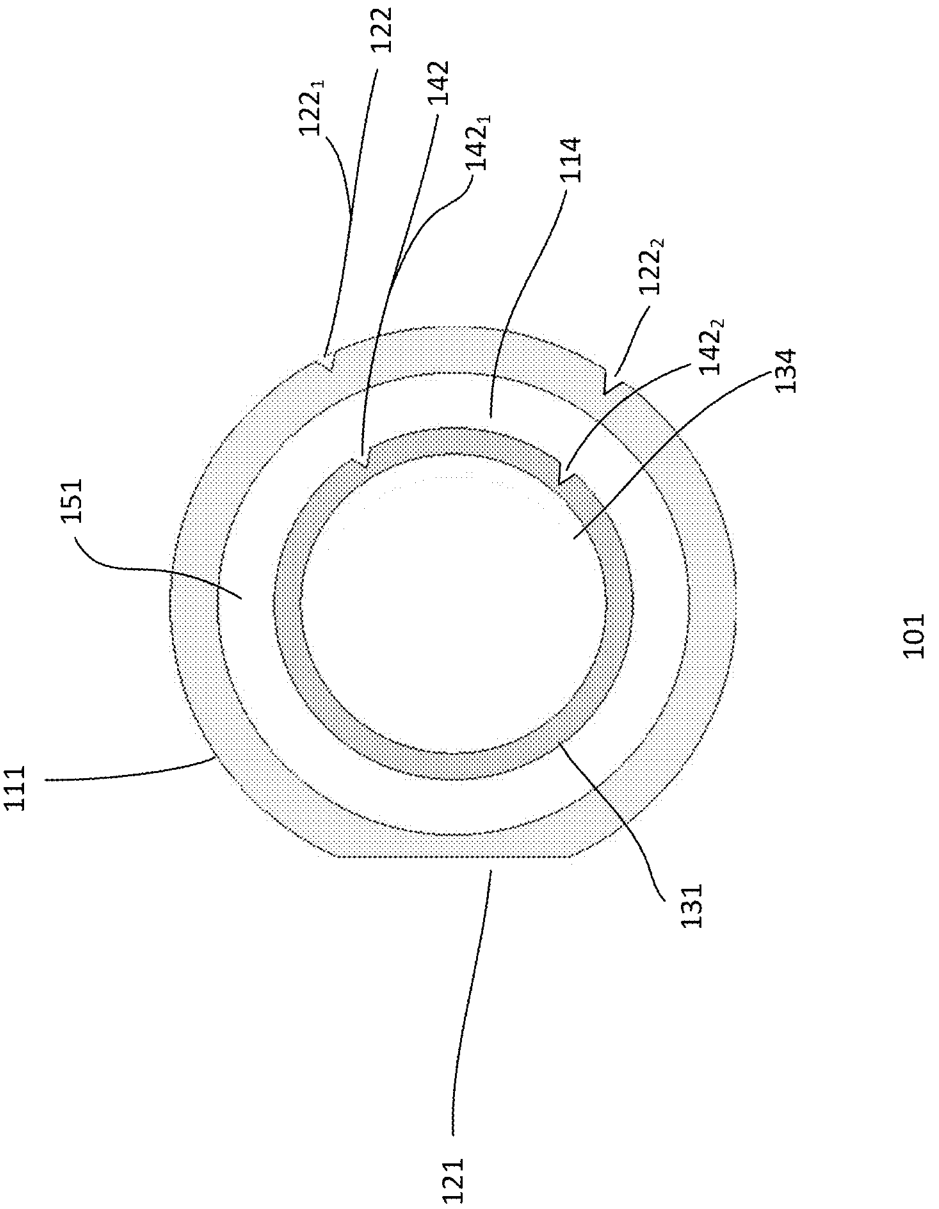
FIGS. 1*a*-1*b* show simplified top views of an embodiment of a wafer adaptor ring assembly with and without a wafer.
Figure 1B:
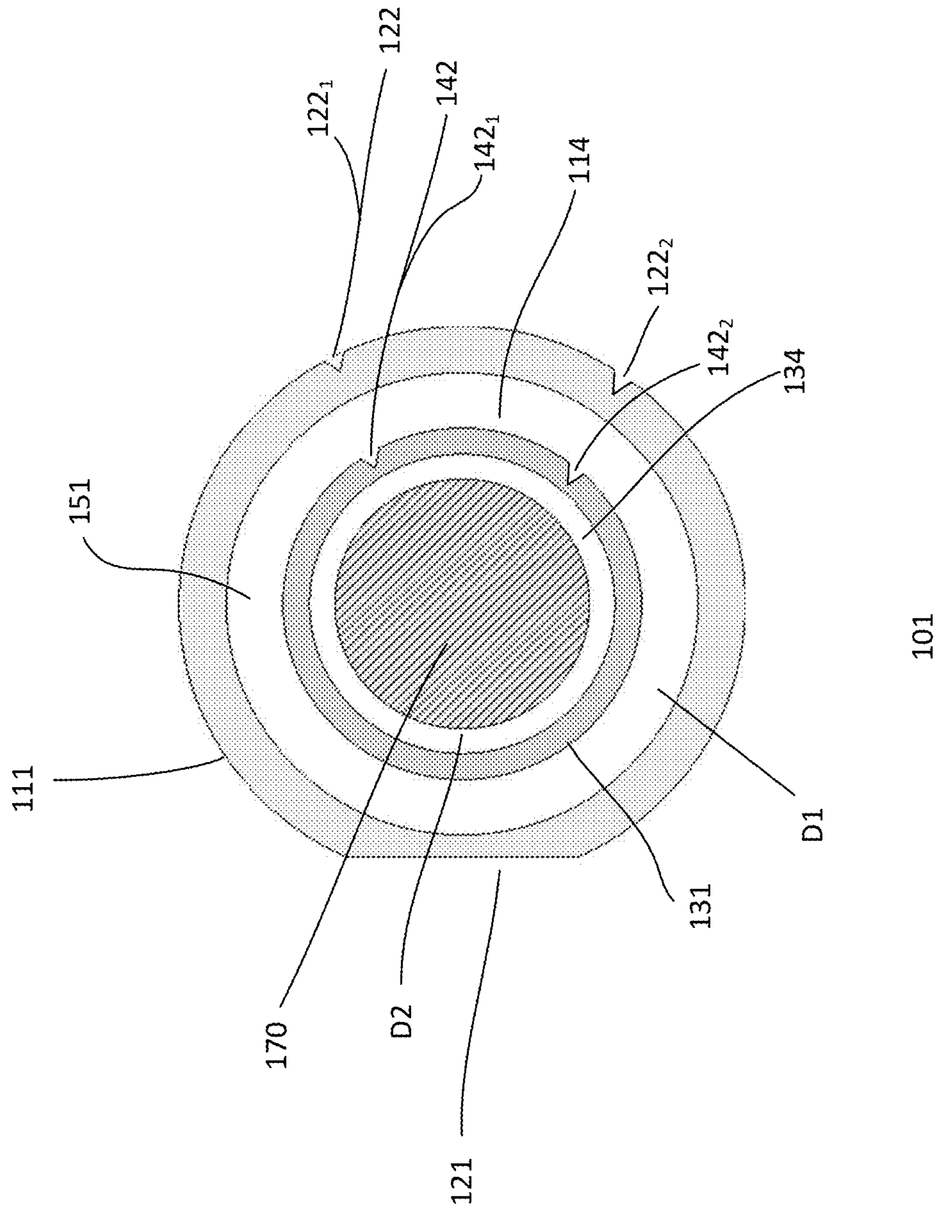

FIGS. 1*a*-1*b* show simplified top views of an embodiment of a wafer adaptor ring assembly 101 with and without a wafer. Referring to FIG. 1*a*, the wafer ring assembly includes a primary wafer ring 111. The primary wafer ring, in one embodiment, is configured to accommodate a wafer having a designated size for plasma dicing by a plasma wafer dicer. The designated sized wafer, for example, may be a 200 nm or a 300 nm wafer. Other sized wafers may also be useful. The primary wafer ring is preferably made of a rigid material. The primary wafer ring is designed to support a wafer for plasma dicing. For example, the primary wafer ring may be formed of metal or alloy. Other types of rigid materials, such as plastic, may also be useful.

The primary wafer ring, in one embodiment, includes inner and outer primary ring edges. The inner edge defines a primary ring opening 114 of the primary wafer ring. The primary ring opening is configured to accommodate a designated sized wafer. As shown, the primary ring opening is a circular shaped opening. Other shaped primary openings capable of accommodating a designated sized wafer may also be useful. As for the outer edge, it forms the circumference of the primary wafer ring. As shown, the outer primary ring edge is circular or substantially circular. Other shaped edges may also be useful. The outer edge, in one embodiment, includes a primary alignment notch 122. In one embodiment, the primary alignment notch includes first and second primary alignment notches $\mathbf{122}_{1\text{-}2}$. The primary alignment notches, as shown, are triangular shaped notches. Other configurations of primary alignment notches, such as the shape and/or the number of notches, may also be useful. The primary alignment notches are employed for alignment purposes.

In one embodiment, the outer edge of the primary wafer ring includes a primary flat outer edge 121. The flat edge, for example, facilitates identifying the orientation of the primary wafer ring. For example, the flat edge is used for alignment purposes. Providing other configurations, including the number of flat edges and/or other shaped edges, may also be useful.

In one embodiment, a bottom surface of the primary wafer ring includes an adhesive sheet 151. The adhesive sheet, for example, may be a transparent or translucent adhesive sheet. Other types of adhesive sheets, such as opaque adhesive sheets, may also be useful. An adhesive side of the adhesive sheet is facing the bottom surface of the primary wafer ring. This facilitates the adhesive sheet in adhering to the bottom surface of the primary wafer ring. The adhesive of the adhesive sheet, for example, is sufficient to attach the adhesive sheet to the primary wafer ring. The primary wafer ring and the adhesive sheet may be collectively referred to as a primary ring sub-assembly.

The ring assembly includes an adaptor wafer ring 131 which is disposed on the adhesive sheet within the primary ring opening. For example, the adaptor wafer ring is laminated within the primary ring opening. For example, after the adaptor wafer ring is placed on the adhesive sheet, a lamination process is performed. The lamination process smoothens the film on a bottom surface of the adaptor wafer ring. The adhesive of the adhesive sheet maintains the adaptor wafer ring in position within the primary ring opening. By smoothening the film, improved adhesion is achieved.

The adaptor wafer ring, in one embodiment, is configured to accommodate a wafer having a smaller size than the designated size for plasma dicing by a plasma wafer dicer. For example, the adaptor wafer ring adapts a smaller sized wafer (adapted sized wafer) than the designated sized wafer for plasma dicing by the plasma wafer dicer. The adaptor wafer ring, in one embodiment, includes inner and outer adaptor ring edges. The inner and outer adaptor ring edges for example are circular shaped, forming a circular shaped adaptor wafer ring. The inner adaptor ring edge defines an adaptor ring opening 134 of the adaptor wafer ring. The adaptor ring opening is configured to accommodate an adapted sized wafer.

The outer adaptor ring edge, in one embodiment, includes an adaptor ring alignment notch 142. In one embodiment, the adaptor ring alignment notch includes first and second adaptor ring alignment notches $\mathbf{142}_{1-2}$. The adaptor ring alignment notches, as shown, are triangular shaped notches. Other configurations of adaptor ring alignment notch, such as the shape and/or the number of notches, may also be useful. The adaptor ring alignment notch is employed for alignment purposes.

Referring to FIG. 1*b,* an adapted sized wafer 170 is disposed on the adhesive sheet within the adaptor ring opening. In one embodiment, a wafer is aligned and mounted onto the adhesive sheet of the primary wafer ring followed by aligning and mounting an adaptor wafer ring onto the primary wafer ring with the wafer. In one embodiment, a gap D1 exists between the adaptor wafer ring and the primary wafer ring, and a gap D2 exists between the adaptor wafer ring and the wafer. The gap D1 may be about 25 mm and the gap D2 may be about 25 mm. Other dimensions for D1 and D2 may also be useful.

The adaptor wafer ring, as discussed, is employed to adapt a smaller sized wafer to the primary wafer ring for plasma dicing. The adaptor wafer ring is configured to increase the mechanical stability of the ring assembly with a smaller sized wafer. For example, the adaptor wafer ring reduces the gap between the primary wafer ring and the wafer by forming gaps D1 and D2, thereby increasing mechanical stability. Depending on the size of the adapted sized wafer and the designated sized wafer, the width of the adaptor wafer ring can be adjusted to fit it between the adapted sized wafer and the primary wafer ring. Preferably, the gaps D1 and D2 are small enough to provide sufficient mechanical stability. Since the primary ring is designed for plasma dicing by a plasma dicing chamber for a specified sized wafer, the use of the adaptor ring enables the plasma dicing chamber to dice a wafer of a smaller size than for which it is designed.

Figure 1C:
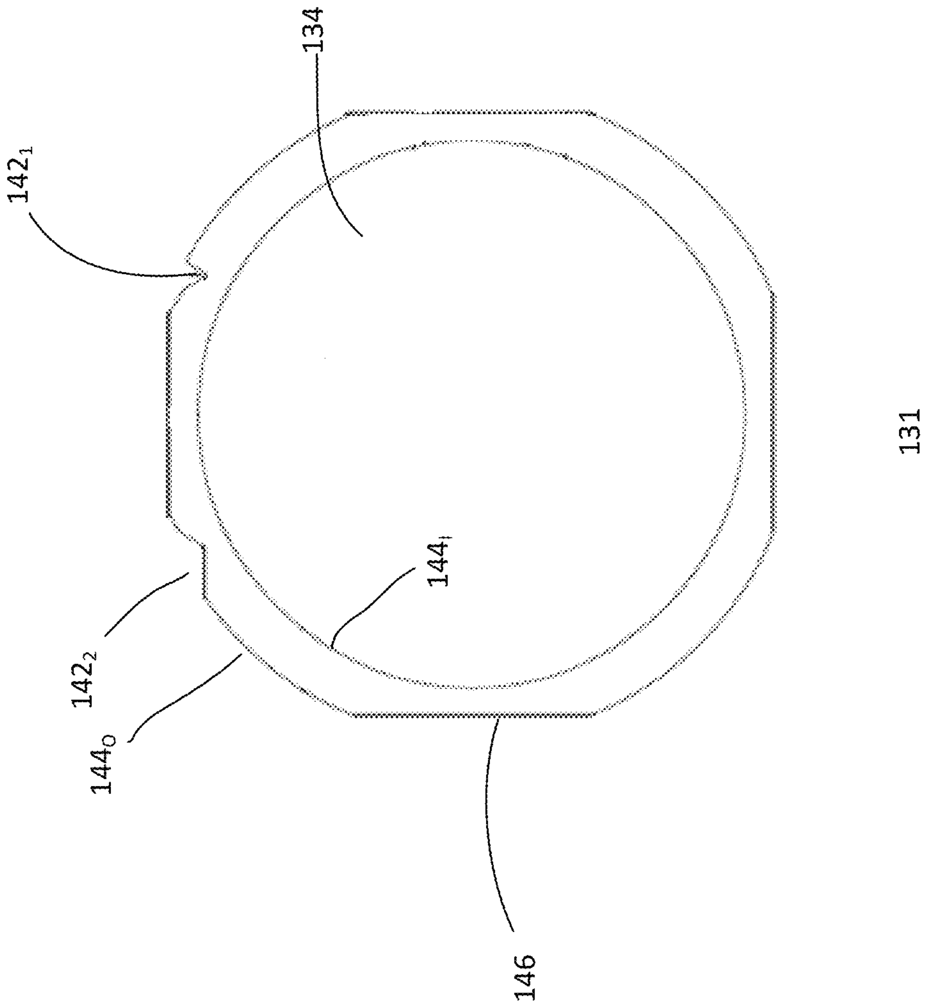
FIG. 1*c* shows a simplified top view of another embodiment of an adaptor ring.

FIG. 1*c* shows a simplified top view of another embodiment of an adaptor wafer ring 131. The adaptor wafer ring, in one embodiment, is configured to accommodate an adapted sized wafer. The adaptor wafer ring, in one embodiment, includes inner and outer adaptor ring edges $\mathbf{144}_I$ and $\mathbf{144}_O$. The inner adaptor ring edge is circular shaped, defining a circular shaped adaptor ring opening 134 for accommodating the adapted sized wafer.

The outer adaptor ring edge, in one embodiment, is a modified circular shaped outer adaptor ring edge. In one embodiment, the outer adaptor ring edge includes flat edges 146 on four sides. For example, first and second opposing sides and third and fourth opposing sides each includes a flat edge. Adjacent to one of the flat edges, the outer adaptor ring edge includes first and second alignment notches $\mathbf{142}_{1-2}$. In one embodiment, one notch $\mathbf{142}_1$ is a v shaped notch while the other notch $\mathbf{142}_2$ is a recessed notch with a flat surface. Providing other shaped notches or configurations of notches may also be useful.

In some embodiments, the inner primary ring edge is configured to accommodate the shape of the outer adaptor ring edge. Alternatively, the inner primary ring edge may be circular shaped to accommodate the modified circular shaped outer adaptor ring edge. Other configurations of edges of the primary and adaptor wafer rings may also be useful.

Figure 2:
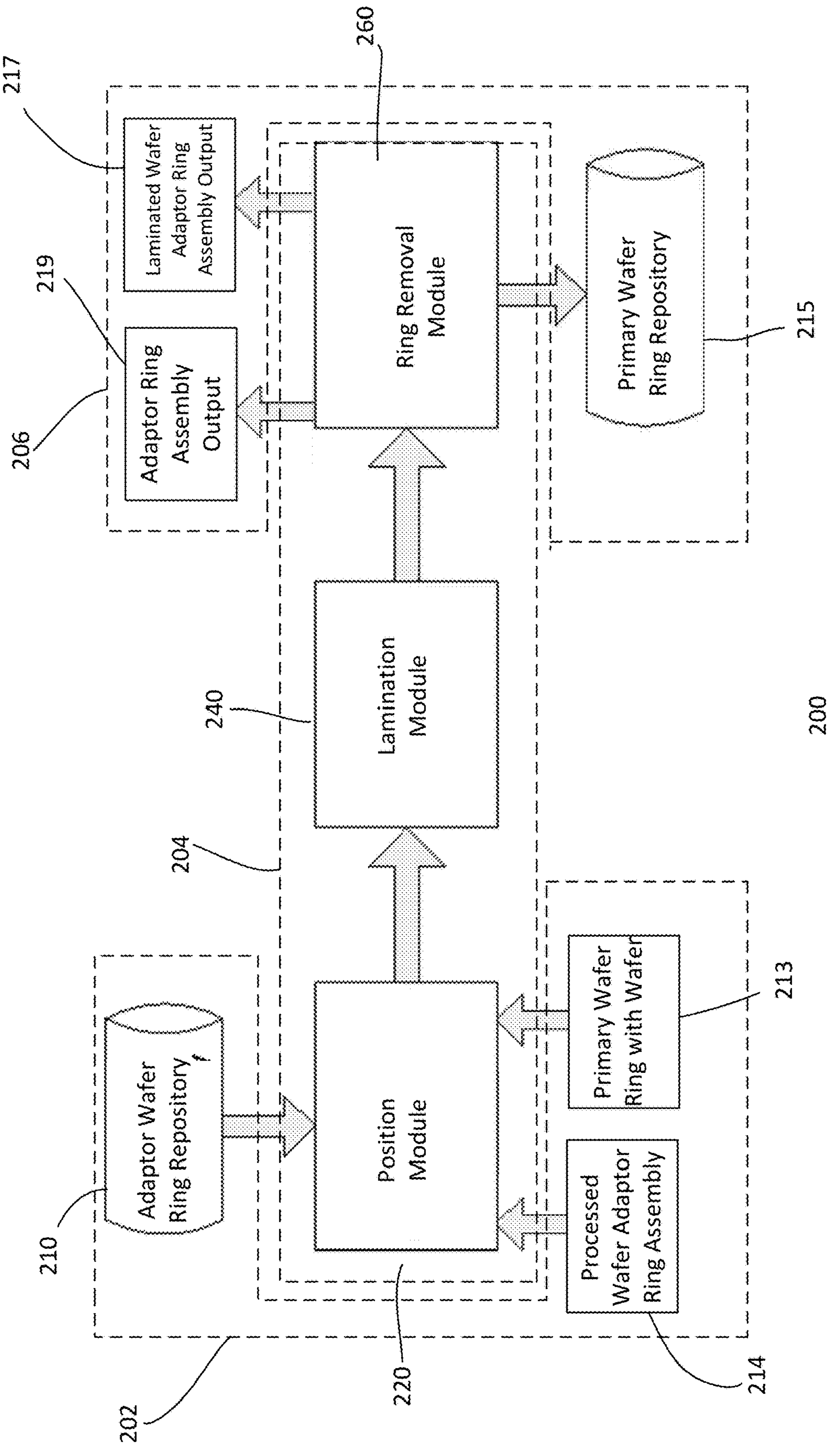
FIG. 2 shows a simplified block diagram of a system for assembling and disassembling a plasma dicing wafer ring assembly.

FIG. 2 shows a simplified block diagram of a system 200 for assembling and disassembling a wafer adaptor ring assembly before and after plasma dicing. The system includes various subsystems for assembling and disassembling a wafer adaptor ring assembly. In one embodiment, the system includes an input subsystem 202, a processing subsystem 204 and an output subsystem 206. The input subsystem includes an adaptor wafer ring repository module 210, a primary wafer ring with wafer module 213 and a processed wafer adaptor ring assembly module 214. The processing subsystem includes a position module 220, a lamination module 240 and a ring removal module 260. As for the output subsystem, it includes a primary wafer ring repository module 215, a wafer adaptor ring assembly output module 217 and an adaptor wafer ring assembly output module 219. Providing the system with other configurations, such as sub-systems and modules may also be useful.

The adaptor wafer ring repository module and the primary wafer ring with wafer module provide input materials, such as an adaptor wafer ring and a primary wafer ring with a wafer for assembly by the position and lamination modules in preparation for plasma dicing. In other embodiments, for example, the lamination process may employ the first and second laminator units at the same time, with the first lamination roller leading the second lamination roller. The lamination is completed when the complete adaptor ring track is laminated by both lamination rollers with the first lamination roller leading the second lamination roller, including the gap portion between the first and second lamination rollers. In one embodiment, the first lamination roller starts from a first predetermined distance, such as about 20 mm, the second lamination roller starts from a second predetermined distance which has been laminated by the first lamination roller. The second predetermined distance is a portion of the first predetermined distance, for example, half of the first predetermined distance. Other configurations of the first and second predetermined distances may also be useful. The lamination is completed when the complete adaptor ring track is laminated by the second lamination roller.

After plasma dicing, in one embodiment, the wafer adaptor ring assembly with the diced wafer is provided by the processed wafer adaptor ring assembly module for processing by the lamination module and the ring removal module to separate the adaptor ring assembly with the diced wafer from the primary ring assembly. The output of the system after ring removal includes the adaptor ring assembly with the diced wafer and the primary ring assembly.

The primary ring assembly is then moved to the primary wafer ring repository in preparation for the separation of the adhesive sheet from the primary wafer ring. The cleaned primary wafer ring is ready for reuse. As for the primary ring assembly with the diced wafer, further processing is performed to separate the dies of the diced wafer and remove the adhesive sheet from the adaptor wafer ring. The cleaned adaptor wafer ring is ready for reuse.

In one embodiment, the adaptor wafer ring repository module is configured to hold a stack of adaptor wafer rings. For example, the adaptor wafer rings are cleaned or the unused adaptor wafer rings are ready for processing by the system.

As for the primary wafer ring with wafer module, it may be configured to feed a primary ring assembly with a wafer attached thereto to the position module. A primary ring assembly with a wafer attached thereto may be referred to as an assembled primary ring assembly. After a wafer has been attached to the primary ring assembly, the assembled primary ring assembly is fed to the position module. For example, a feed or transfer unit of the primary wafer ring transfers the assembled primary ring assembly to the position module for processing.

In one embodiment, the primary wafer ring with wafer module may be configured to assemble the primary ring assembly with the wafer. For example, a primary ring assembly is provided and a wafer is attached to the adhesive sheet. In other embodiments, the primary wafer ring with wafer module is provided with a supply of assembled primary ring assemblies with wafers. The primary wafer ring with wafer module, in such cases, feeds the assembled primary ring assemblies with wafers to the position module one at a time. For example, a feed or transfer unit of the primary wafer ring transfers the assembled primary ring assembly to the position module for processing.

The position module is configured to receive the assembled primary ring assembly. The position module, in one embodiment, includes a position assembly positioning unit, a position head unit, a position chuck table unit, a position assembly lock unit and a position output transfer unit. Providing the position module with other units may also be useful.

The position assembly positioning unit is configured to receive the assembled primary ring assembly. The positioning unit positions the assembled primary ring assembly into position onto the position chuck table unit. When the assembled primary ring assembly is positioned onto the position chuck table unit, a position assembly lock unit, such as a mechanical lock unit, locks and maintains the assembled primary ring assembly in position for processing.

In one embodiment, processing includes configuring the position head unit to pick up an adaptor wafer ring from the adaptor wafer ring repository. The position head positions the adaptor ring into position on the assembled primary ring assembly. For example, the position head aligns the adaptor ring in position. Once aligned, the position head moves downwards and places the adaptor ring on the adhesive sheet of the assembled primary ring assembly between the primary wafer ring and the wafer. After positioning the adaptor ring on the assembled primary ring assembly, the position head releases the adaptor wafer ring and is retracted (raised upwards) away from the assembled primary ring assembly. This leaves the adaptor ring on the assembled primary ring assembly, forming the wafer adaptor ring assembly. Although the adhesive sheet holds the adaptor ring in position, it is not fully bonded at this point.

The position lock unit disengages to free the wafer adaptor ring assembly. A position output transfer unit transfers the wafer adaptor ring assembly from the position module to the lamination module. In one embodiment, the lamination module is configured to laminate the adaptor ring to the adhesive sheet of the wafer adaptor ring assembly prior to the plasma dicing of the wafer. In one embodiment, the lamination module is also configured to cut the adhesive sheet after wafer dicing. Cutting the adhesive sheet is a precursor to separating the adaptor ring assembly with the diced wafer from the primary ring assembly.

The lamination module, in one embodiment, includes a lamination assembly positioning unit, a lamination module chuck table, a lamination head unit, a lamination lock unit, a laminator unit, a cutter unit and a lamination output transfer unit. Providing the lamination module with other units may also be useful. An incoming wafer adaptor ring assembly with a wafer is received by the lamination module. The wafer adaptor ring assembly with the wafer is positioned on the lamination module chuck table and locked into position. In one embodiment, the lamination positioning unit receives the wafer adaptor ring assembly and positions it on the lamination chuck table. Once in position, the lamination lock unit locks the wafer adaptor ring assembly in place. The lamination head unit moves into position, pressing the wafer adaptor ring assembly against the table. The chuck table has a table diameter which is smaller than the diameter of the inner edge of the adaptor wafer ring. When the wafer adaptor ring assembly is positioned on the lamination chuck table, the adaptor wafer ring is not on the table. As for the lamination head unit, it covers the adaptor wafer ring and wafer of the wafer adaptor ring assembly.

The laminator unit engages to laminate the adaptor wafer ring to the adhesive sheet of the wafer adaptor ring assembly. In one embodiment, the lamination unit is engaged by moving it upwards from underneath the wafer adaptor ring assembly to press against the adhesive sheet and the adaptor wafer ring. The laminator unit rotates around an adaptor ring track which follows or tracks the adaptor wafer ring. The laminator unit is configured to activate the adhesive and smoothen out the adhesive sheet, laminating the adaptor wafer ring to the adhesive sheet. After lamination, the assembling of the wafer adaptor ring assembly is completed.

The completed or laminated wafer adaptor ring assembly is transferred to the wafer adaptor ring output module. For example, the lamination lock unit is disengaged and a lamination output transfer unit transfers the wafer adaptor ring assembly to the wafer adaptor ring assembly output module. The wafer adaptor ring assembly output module may be configured to store a stack of completed wafer adaptor ring output modules. When the stack is full, the stack is then transferred to the plasma dicing tool for processing. Other configurations of transferring the completed wafer adaptor ring assembly for subsequent processing may also be useful.

In one embodiment, the wafer adaptor ring assembly output module is in communication with the ring removal module. For example, after the wafer adaptor ring assembly is completed, it is transferred to the wafer adaptor ring assembly output module through the ring removal module. Other configurations of the wafer adaptor ring assembly output module may also be useful. For example, the wafer adaptor ring assembly output module may be in direct communication with the lamination module.

After plasma dicing, the processed wafer adaptor ring assembly is provided to the processed wafer adaptor ring assembly module. For example, a stack of processed wafer adaptor ring assemblies is provided to the processed wafer adaptor ring assembly module. The processed ring assembly module provides a processed wafer adaptor ring assembly to the lamination module for processing. In one embodiment, the processed wafer adaptor ring assembly module provides the processed ring assembly to the lamination module via the position module. Other configurations for providing the processed wafer adaptor ring assembly to the lamination module may also be useful. For example, the processed wafer adaptor ring assembly may be provided directly to the lamination module.

In one embodiment, the lamination module receives the processed wafer adaptor ring assembly for processing. Processing of the processed wafer adaptor ring assembly includes cutting the adhesive sheet under the adaptor wafer ring. The processed wafer adaptor assembly is positioned on the lamination module chuck table and locked into position. In one embodiment, the lamination positioning unit receives the wafer adaptor ring assembly and positions it on the lamination chuck table. Once in position, the lamination lock unit locks the wafer adaptor ring assembly in place. The lamination head unit moves into position, pressing the wafer adaptor ring assembly against the table.

The cutter unit is engaged to cut the adhesive sheet under the adaptor wafer ring. In one embodiment, the cutter unit is engaged by moving it upwards from underneath the wafer adaptor ring assembly to press against the adhesive sheet and the adaptor wafer ring. The cutter unit rotates around an adaptor ring track which follows or tracks the adaptor wafer ring. The cutter unit is configured to cut the adhesive sheet under the adaptor wafer ring. After the adhesive sheet is cut, the cut processed wafer adaptor ring assembly is transferred to the ring removal module. For example, the lamination output transfer unit transfers the processed wafer adaptor ring assembly to the ring removal module.

The ring removal module includes a ring removal positioning unit, a ring removal head unit, a ring removal chuck table unit, a ring removal assembly lock unit, a ring separator unit and a ring removal output transfer unit. The ring removal positioning unit positions the cut processed wafer adaptor ring assembly on the ring removal chuck table unit. Once in position, the ring removal lock unit locks the wafer adaptor ring assembly in place.

The ring separator unit is positioned on the wafer adaptor ring assembly. For example, primary separator posts on the separator unit are positioned on the primary wafer ring and adhesive sheet posts are positioned on the adhesive sheet between the primary wafer ring and adaptor wafer ring. The ring removal head unit is positioned over the wafer adaptor ring assembly. In one embodiment, the removal head unit covers the adaptor ring assembly. After the ring removal head unit is positioned over the adaptor ring assembly, the ring removal chuck table unit is moved upwards along with the ring removal head unit. This separates the adaptor ring assembly with the diced wafer from the primary ring assembly.

After separation, the primary ring assembly is transferred to the primary ring repository. For example, the primary ring repository is configured to hold a stack of primary ring assemblies with the cut adhesive sheets. When the repository is full, the stack is transferred to remove the adhesive sheets, resulting in cleaned primary wafer rings for reuse.

As for the adaptor ring assembly, it is transferred to the adaptor ring assembly output module. The adaptor ring assembly output module may store a stack of adaptor ring assemblies. When full, the stack of adaptor ring assemblies is transferred for subsequent processing, such as separating the dies of the diced wafer from the adhesive sheet and separating the adhesive sheet from the adaptor wafer ring, resulting in a clean adaptor wafer ring for reuse.

Figure 3:
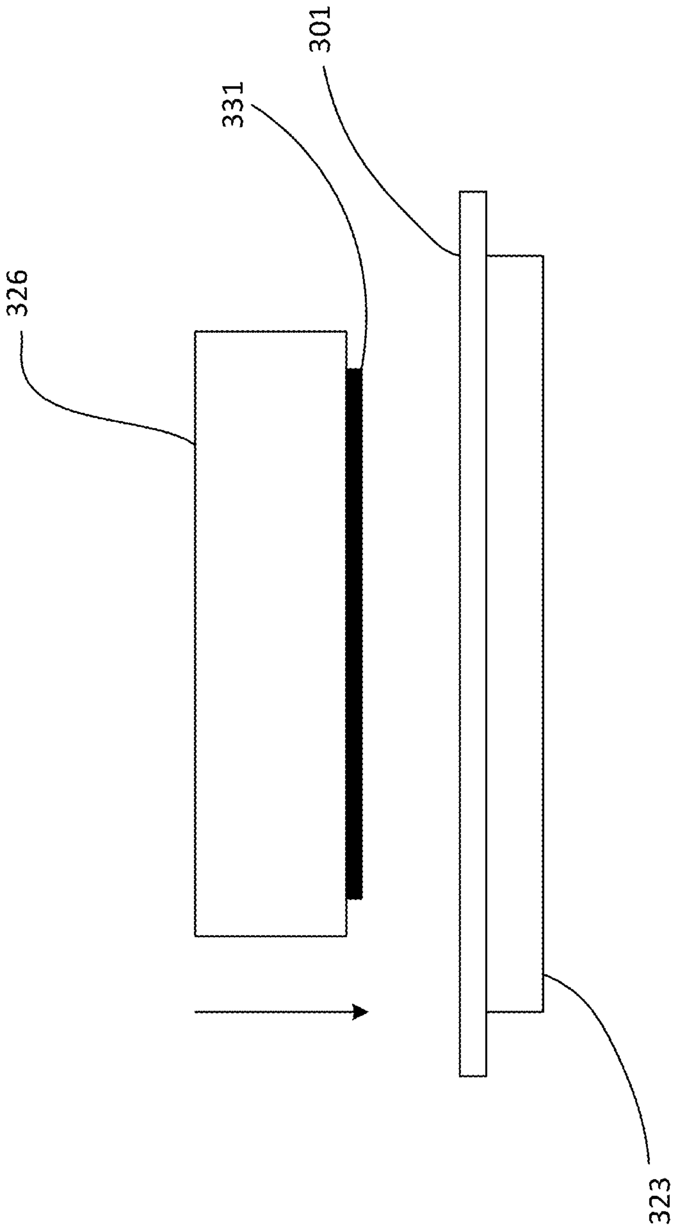
FIG. 3 shows a simplified side view of a position module of the system for adapting a wafer for plasma dicing.

FIG. 3 shows a simplified side view of a position module 320. As shown, the position module includes a position chuck table 323 and a position head unit 326. A position assembly positioning unit is configured to receive an assembled primary ring assembly 301. The assembled primary ring assembly includes an adhesive sheet laminated to a bottom surface of a primary wafer ring and a wafer laminated onto the adhesive sheet. The position assembly positioning unit positions the assembled primary ring assembly into position onto the position chuck table unit. A position assembly lock unit locks and maintains the assembled primary ring assembly in position. In one embodiment, the chuck table may include a heating unit to preheat the adhesive sheet when positioned thereon. Preheating the adhesive sheet may, for example, advantageously activate the adhesive layer to easily laminate the adaptor ring. Another advantage is to shrink the adhesive sheet to give it more tension when the adaptor ring is placed thereon, preventing or reducing wrinkles on the adhesive sheet after lamination to improve adhesion.

The position head unit picks up an adaptor wafer ring 331 and aligns it to the primary ring assembly. When the adaptor wafer ring is aligned, the position head unit moves downwards to place the adaptor wafer ring on the adhesive sheet. The position head releases the adaptor wafer ring and is retracted away from the assembled primary ring assembly. The position lock unit disengages to free the wafer adaptor ring assembly. A position output transfer unit transfers the wafer adaptor ring assembly from the position module for further processing.

Figure 4A:
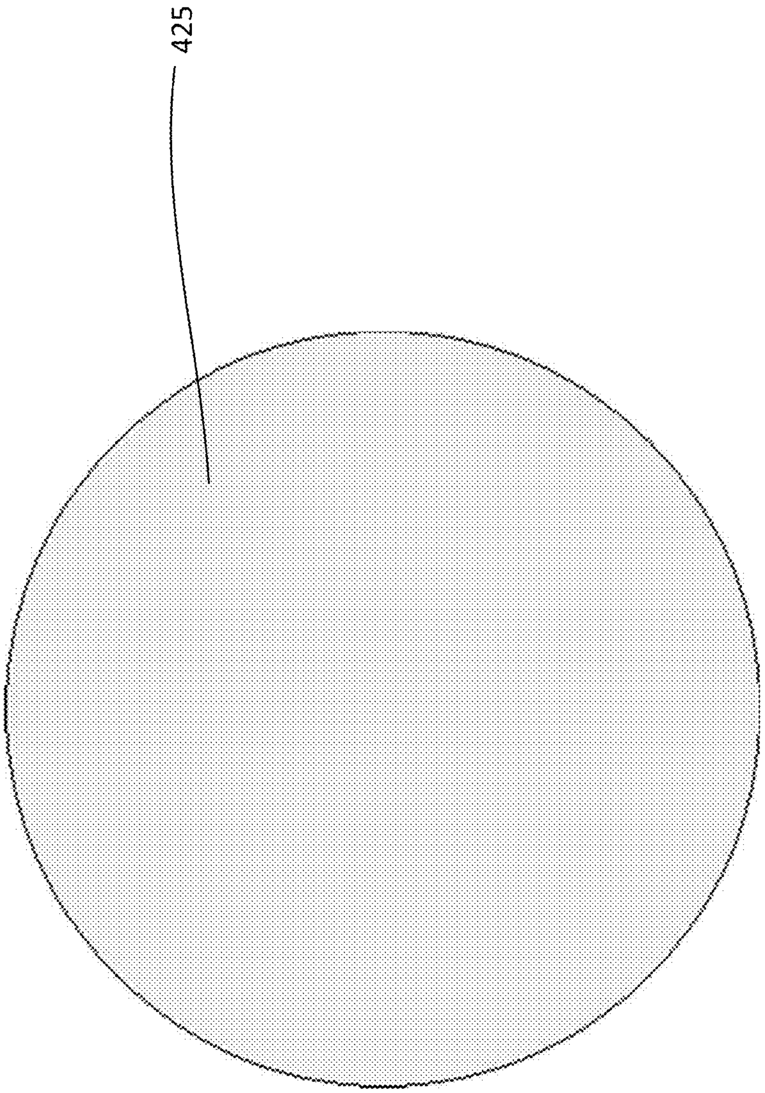
FIGS. 4*a*-4*c* show simplified top views of various embodiments of a positioning table of the position module.
Figure 4B:
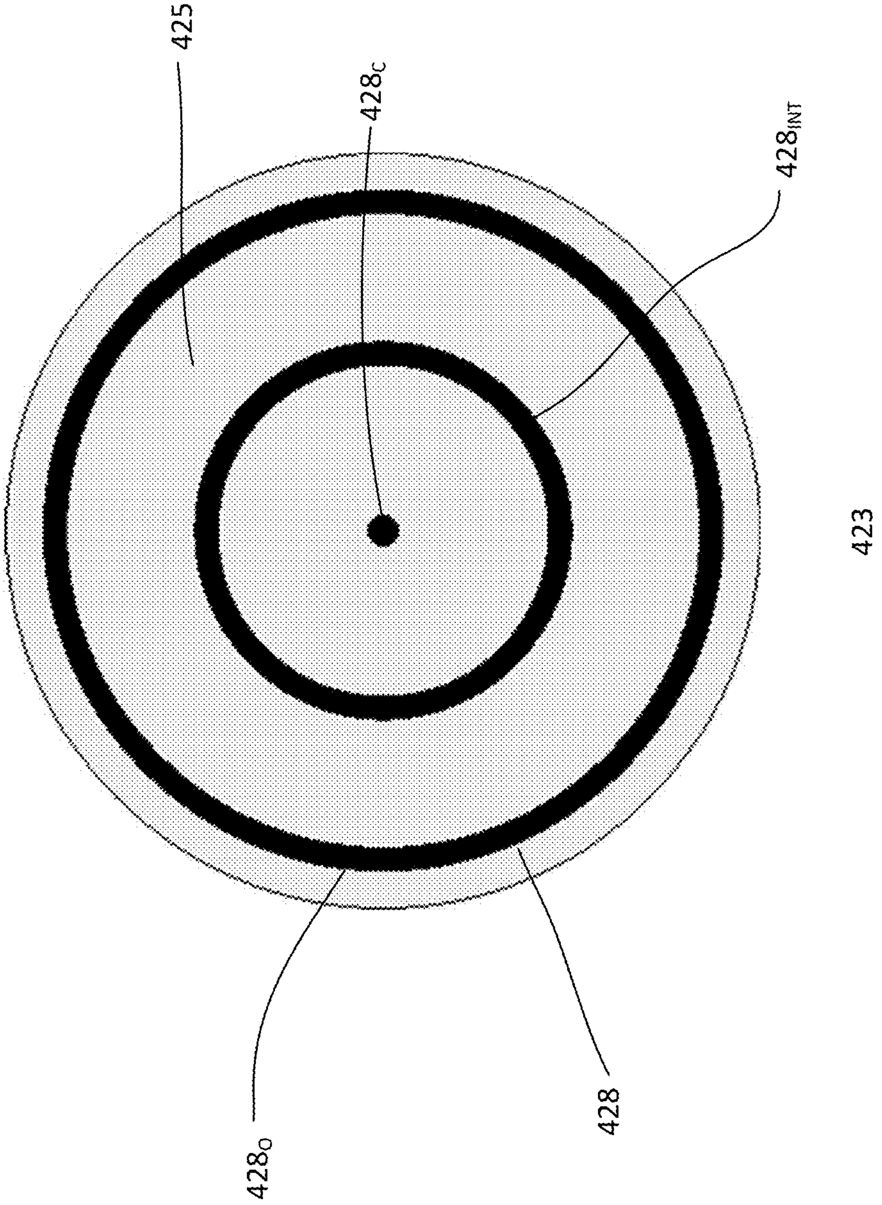
Figure 4C:
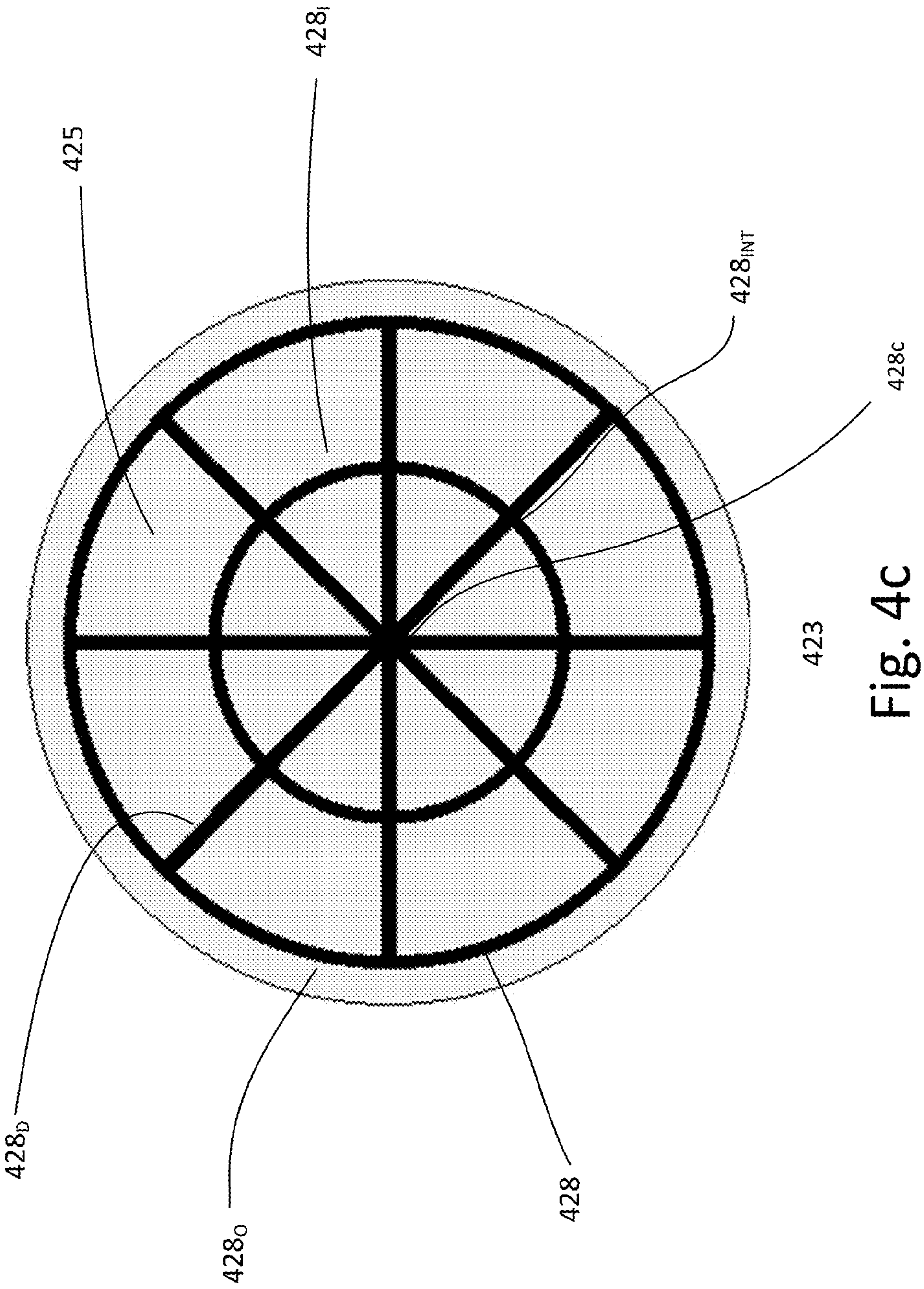

FIGS. 4*a*-4*c* show top views of various embodiments of chuck table units 423. As shown in FIG. 4*a*, a top surface 425 of the chuck table unit includes a flat top surface. The top surface is configured to support the adhesive sheet of the primary ring assembly. The lock unit holds the primary ring assembly in position. In other embodiments, as shown in FIGS. 4*b*-4*c*, the flat top surface 425 may include a plurality of grooves 428, forming a groove pattern. The grooves facilitate stabilizing the wafer. In addition, the grooves may reduce spring back when the adhesive sheet is released from the table.

In FIG. 4*b*, the groove pattern includes grooves 428 on the top surface of the table. For example, the grooves may include an outer circular groove $\mathbf{428}_O$, an intermediate circular groove $\mathbf{428}_{INT}$ and an inner central groove $\mathbf{428}_C$. Providing multiple intermediate grooves between the outer and central grooves may also be useful.

In another embodiment, as shown in FIG. 4*c*, the groove pattern includes concentric and diametric grooves 428. For example, the groove pattern includes an outer circular groove $\mathbf{428}_O$, an intermediate circular groove $\mathbf{428}_{INT}$ and an inner central groove $\mathbf{428}_C$. A plurality of diametric grooves $\mathbf{428}_D$ extend from the opposing sides of the outer circular groove through the central groove. Other configurations of groove patterns may also be useful.

Figure 5A:
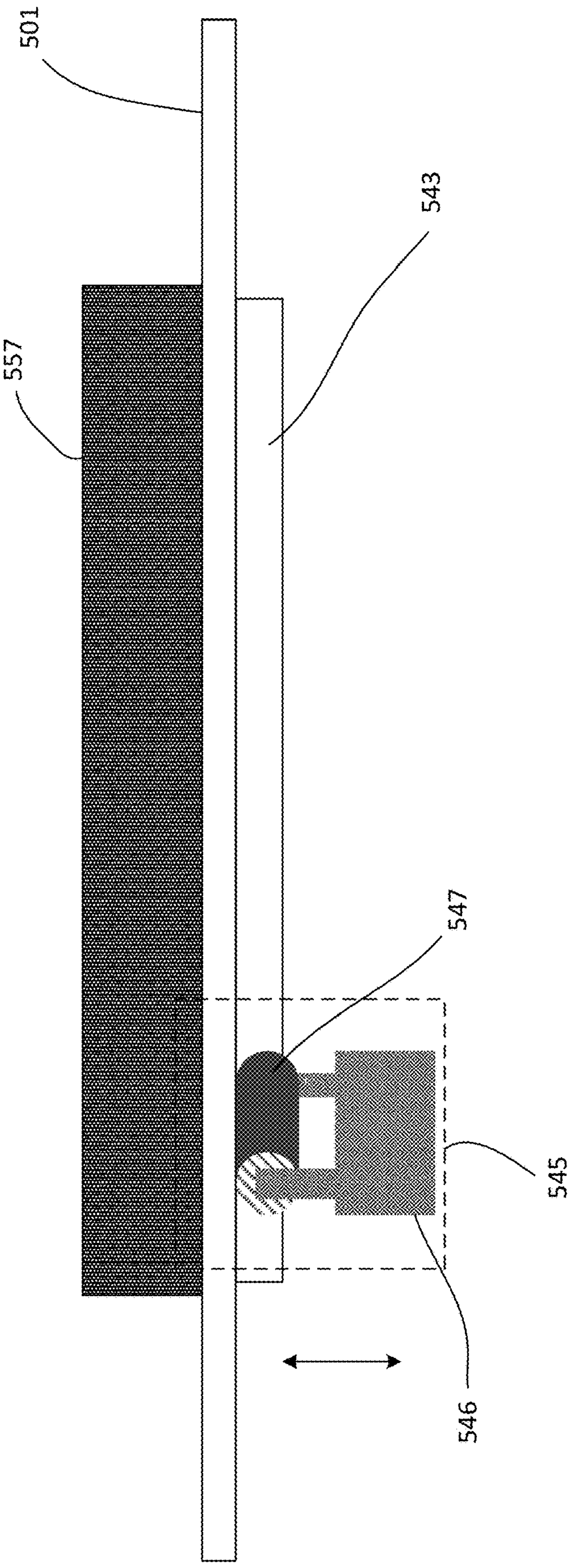
FIGS. 5*a*-5*b* show simplified side and top views of a lamination module of the system for adapting a wafer for plasma dicing.
Figure 5B:
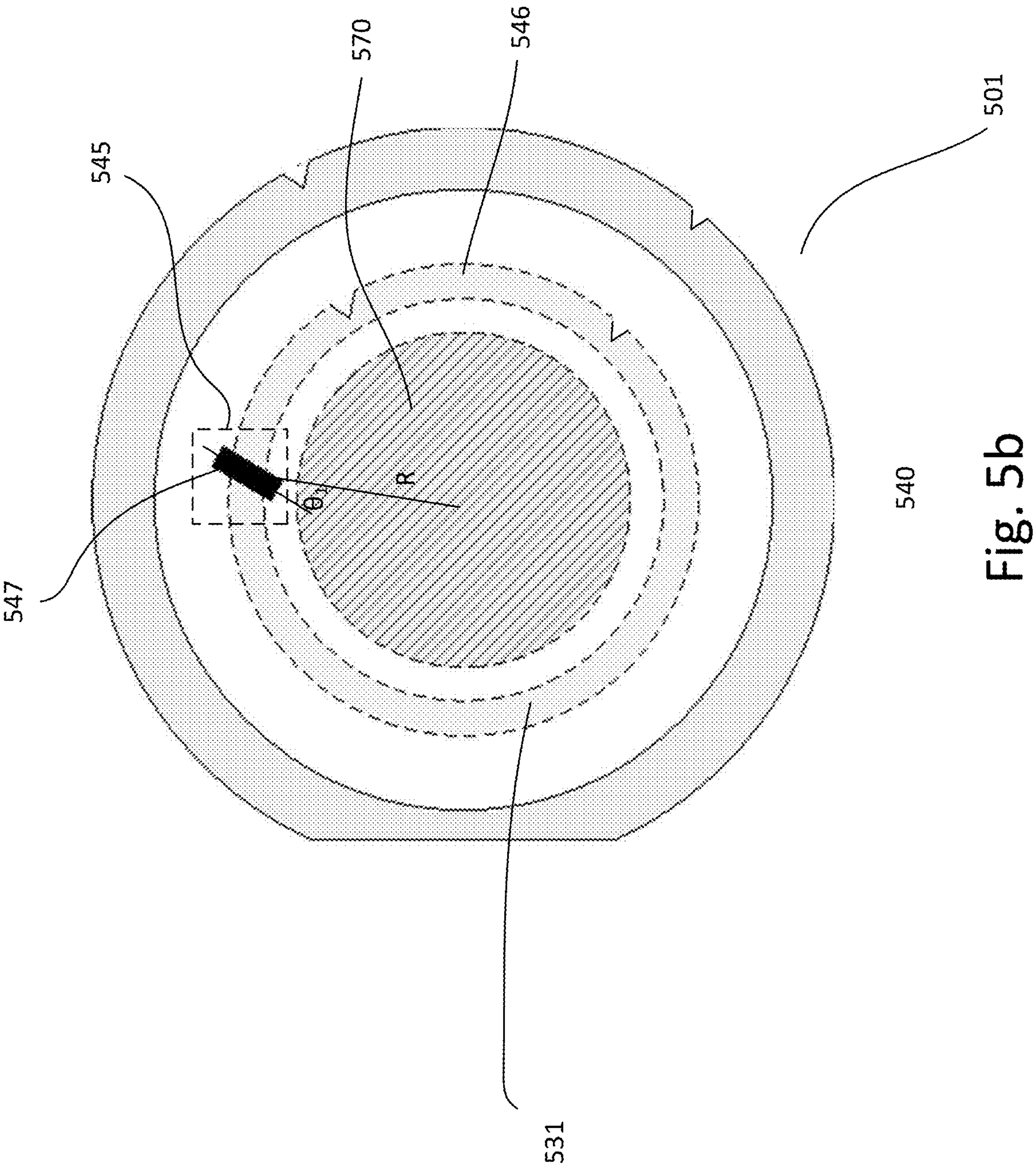

FIGS. 5*a*-5*b* show simplified side and top views of a lamination module 540 of the system for adapting a wafer 570 for plasma dicing. The lamination module includes a lamination module chuck table 543, a lamination head unit 557 and a laminator unit 545. The lamination module may include other units which are not shown, such as a lamination assembly positioning unit, a lamination head unit, a lamination lock unit, a lamination processing unit, a cutter unit and a lamination output transfer unit. Providing the lamination module with other units may also be useful.

The wafer adaptor ring assembly 501, as shown, is positioned on the lamination chuck table by the lamination position unit and locked into position by the lamination lock unit. Once locked into position, the lamination head unit is lowered onto the lamination chuck table unit, pressing against a portion of the wafer adaptor ring assembly. For example, the lamination head unit is configured to press against the adaptor wafer ring and wafer of the wafer adaptor ring assembly.

The laminator unit is engaged by moving upwards to press against the adhesive sheet below the adaptor wafer ring. In one embodiment, the lamination unit includes a lamination base 546 which holds a lamination roller 547. The lamination roller, for example, is configured to freely rotate about a roller axis which is parallel to the plane of the lamination chuck table. The lamination roller, for example, is a silicon rubber roller. Other types of materials for the lamination roller may also be useful.

In one embodiment, the laminator unit is mounted on a processing base of a lamination processing unit (not shown). The processing base is configured to rotate about a processing base axis, which is perpendicular to the plane of the lamination chuck table. The processing base axis, in one embodiment, is through a center of the lamination chuck table. To engage, the base elevates the lamination roller so it contacts the adhesive sheet and presses against the adaptor wafer ring.

The base rotates, causing the lamination roller to rotate along an adaptor ring track 531 which tracks the adaptor wafer ring. In one embodiment, the roller is configured at a roller angle θ to a radius R of the adaptor ring track. The roller angle θ is configured to remove bubbles between the adaptor wafer ring and the adhesive sheet, improving adhesion from the lamination process. In addition, heat may be applied to the adhesive sheet to facilitate the lamination process. In one embodiment, the angle θ may be about ±40-50°. Preferably, the roller angle θ is about 45°. Other angles may also be useful. Once lamination is completed, the roller is retracted to disengage it from the adhesive sheet.

Figure 5C:
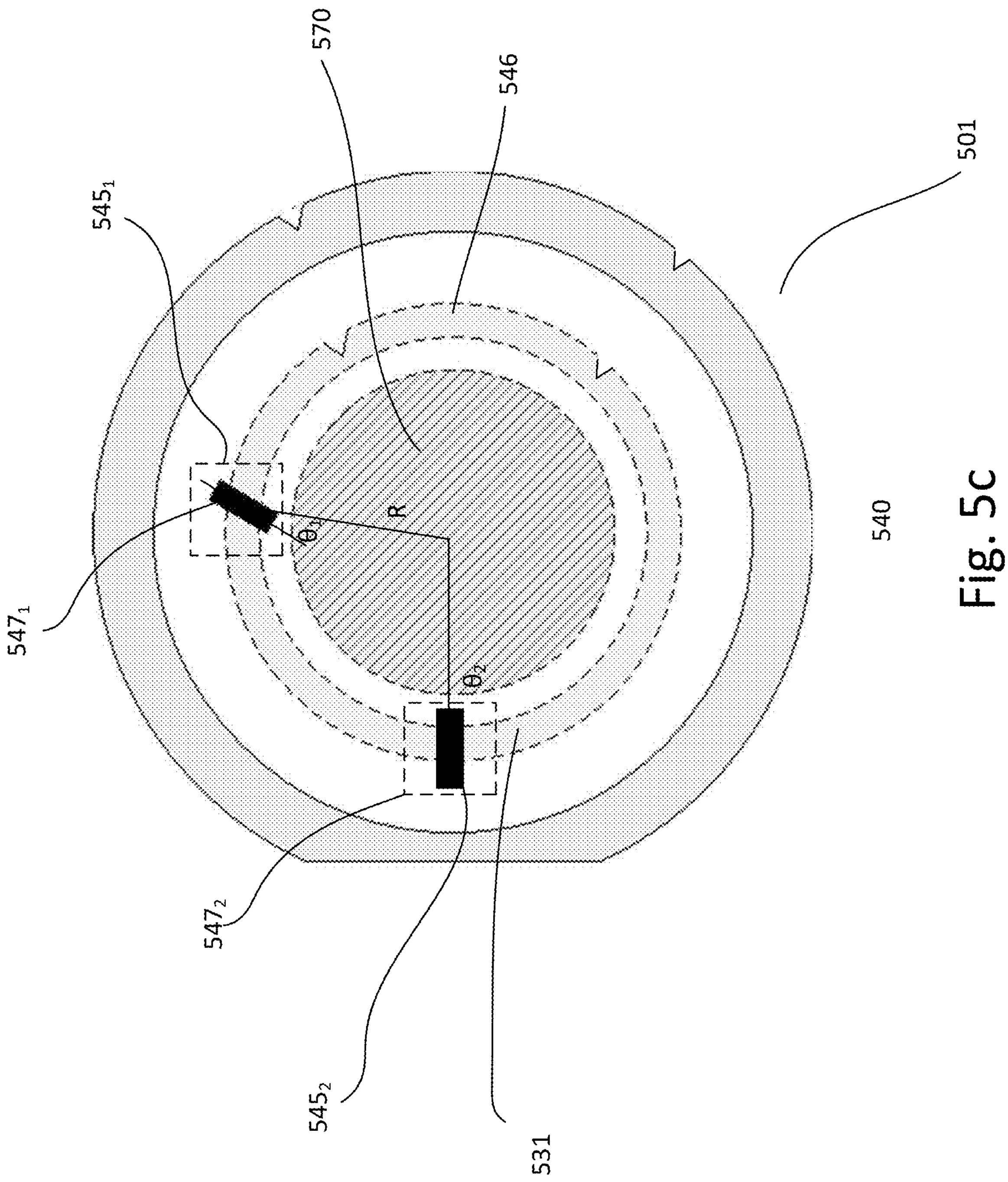
FIG. 5*c* shows a simplified top view of another embodiment of a lamination module.

FIG. 5*c* shows a simplified top view of another embodiment of the lamination module. The lamination module is similar to that described in FIG. 5*a*-5*b*. Common elements may not be described or described in detail.

In one embodiment, the lamination module includes first and second laminator units $\mathbf{545}_{1-2}$ with first and second lamination rollers $\mathbf{547}_{1-2}$. The first lamination roller $\mathbf{547}_1$ is configured at a first roller angle $\theta_1$ of about 40-50° to a radius R of the adaptor ring track, similar to the laminator unit of FIGS. 5*a*-5*b*. As for the second lamination roller $\mathbf{547}_2$, it is configured to rotate at a second roller angle $\theta_2$ of about 0°. In one embodiment, the lamination module is configured to laminate the adaptor ring to the adhesive sheet using a two-step lamination process. The first step of the lamination process employs the first laminator unit with the angled lamination roller to smoothen out the adhesive sheet under the adaptor ring; the second step of the lamination process employs the second laminator unit with the non-angled lamination roller to press the adhesive sheet to the adaptor ring, improving adhesion. Other configurations of the lamination process may also be useful.

In other embodiments, for example, the lamination process may employ the first and second laminator units at the same time, with the first lamination roller leading the second lamination roller. The lamination is completed when the complete adaptor ring track is laminated by both lamination rollers with the first lamination roller leading the second lamination roller, including the gap portion between the first and second lamination rollers. In one embodiment, the first lamination roller starts from a first predetermined distance, such as about 20 mm, the second lamination roller starts from a second predetermined distance which has been laminated by the first lamination roller. The second predetermined distance is a portion of the first predetermined distance, for example, half of the first predetermined distance. Other configurations of the first and second predetermined distances may also be useful. The lamination is completed when the complete adaptor ring track is laminated by the second lamination roller.

Figure 6A:
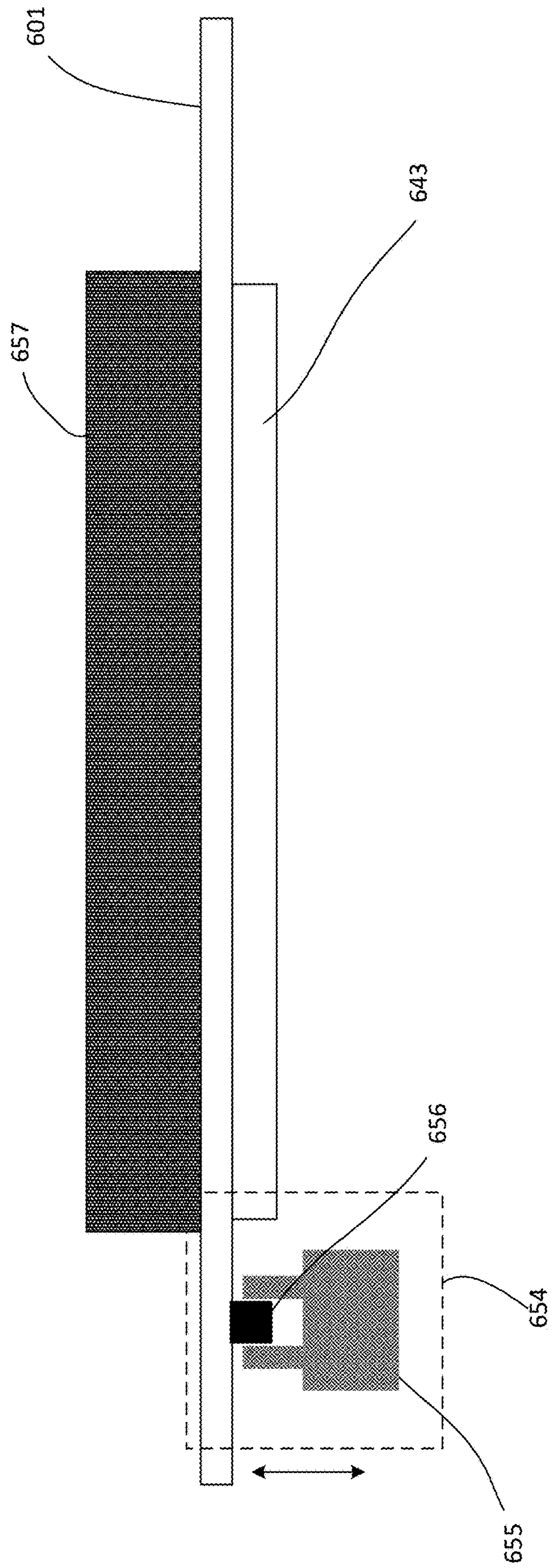
FIGS. 6*a*-6*b* show simplified side and top views of a lamination module adapted for cutting an adhesive film of plasma dicing ring after plasma dicing of the wafer.
Figure 6B:
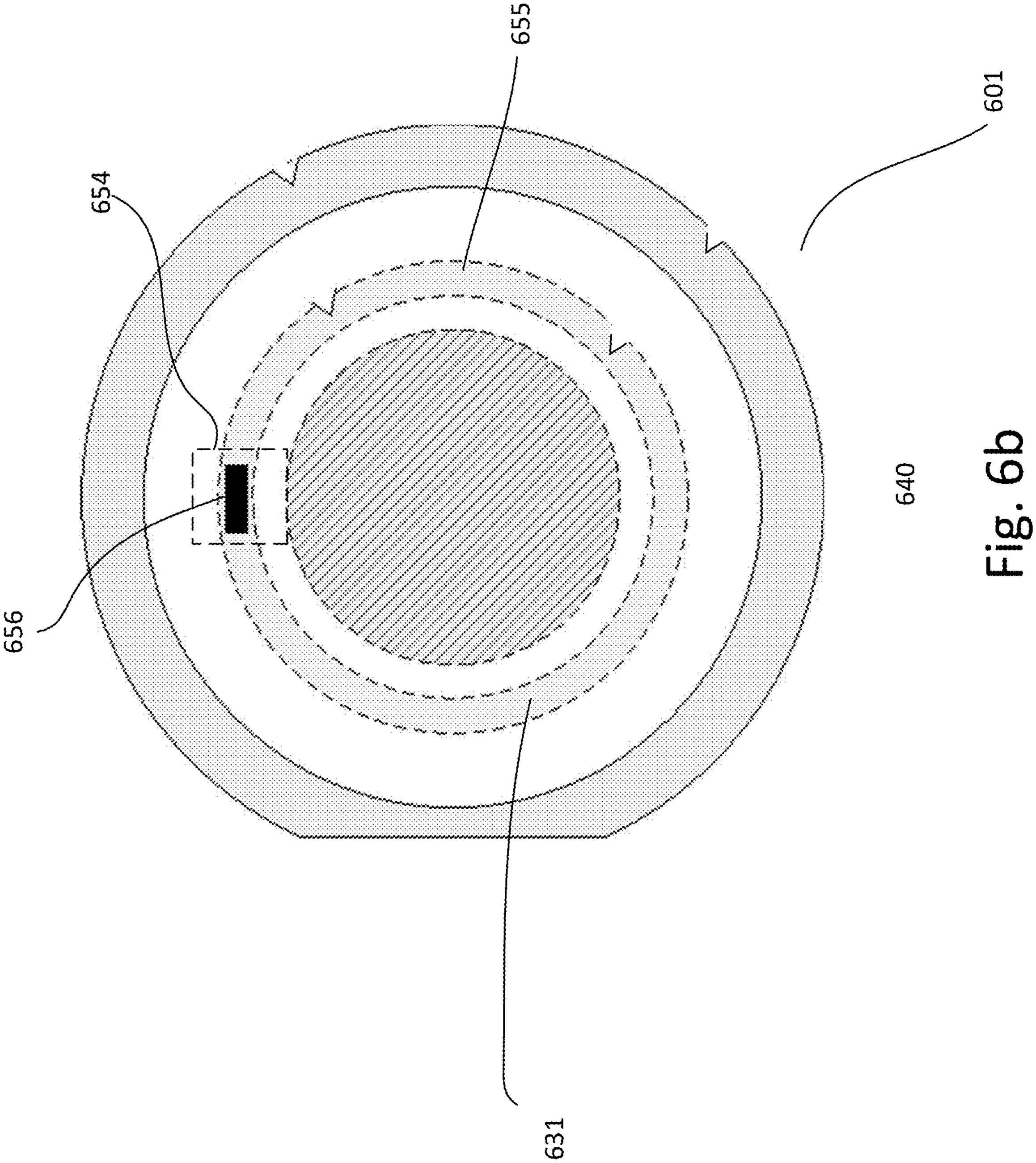

FIGS. 6*a*-6*b* show simplified side and top views of the lamination module 640 of the system with the cutter unit 654 engaged. For example, the lamination module is configured to perform both lamination and cutting. Common elements of the lamination module may not be described or described in detail.

As shown, a processed wafer adaptor ring assembly 601 is positioned on the lamination chuck table 643 by the lamination position unit and locked into position by the lamination lock unit. Once locked into position, the lamination head unit 657 is lowered onto the lamination chuck table unit, pressing against a portion of the wafer adaptor ring assembly. For example, the lamination head unit is configured to press against the adaptor wafer ring and wafer of the wafer adaptor ring assembly.

The cutter unit 654 is engaged by moving upwards to press against the adhesive sheet below the adaptor wafer ring. In one embodiment, the cutter unit includes a cutter base 655 which holds a cutter 656. The cutter, for example, is a blade which is mounted to the cutter base. The cutter, for example, may be a roller type cutter. Other types of cutters may also be useful.

In one embodiment, the cutter unit is mounted on the processing base of a lamination processing unit (not shown), on which the laminator unit is also mounted. For example, the processing base may include arms which extend outwards from the center to accommodate the different processing units, such as the laminator and cutter units. To engage, the cutter base elevates the cutter so it contacts the adhesive sheet and presses against the adaptor wafer ring.

The base rotates, causing the cutter to rotate along an adaptor ring track 631 which tracks the adaptor wafer ring. Once cutting the adhesive sheet is completed, the cutter is retracted to disengage it from the adhesive sheet.

Figure 6C:
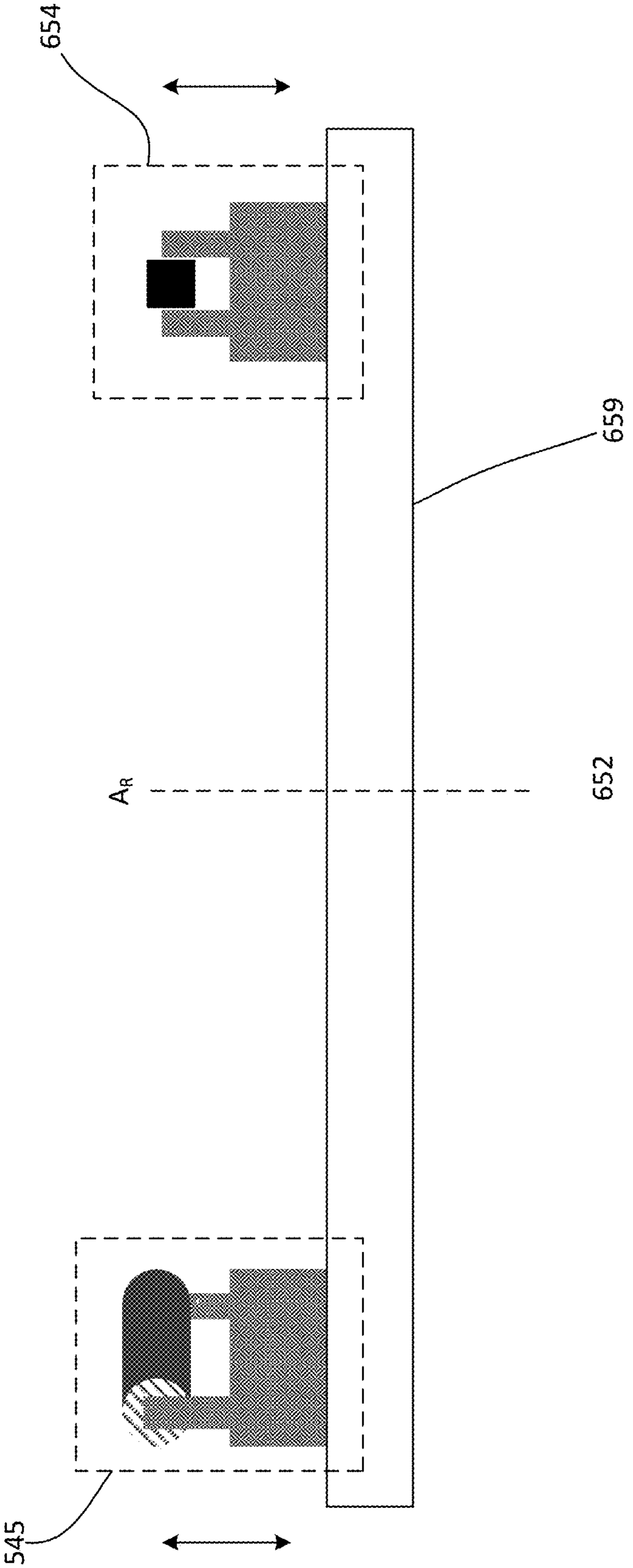
FIGS. 6*c*-6*d* show simplified side and top views of a processing unit of a lamination module.
Figure 6D:
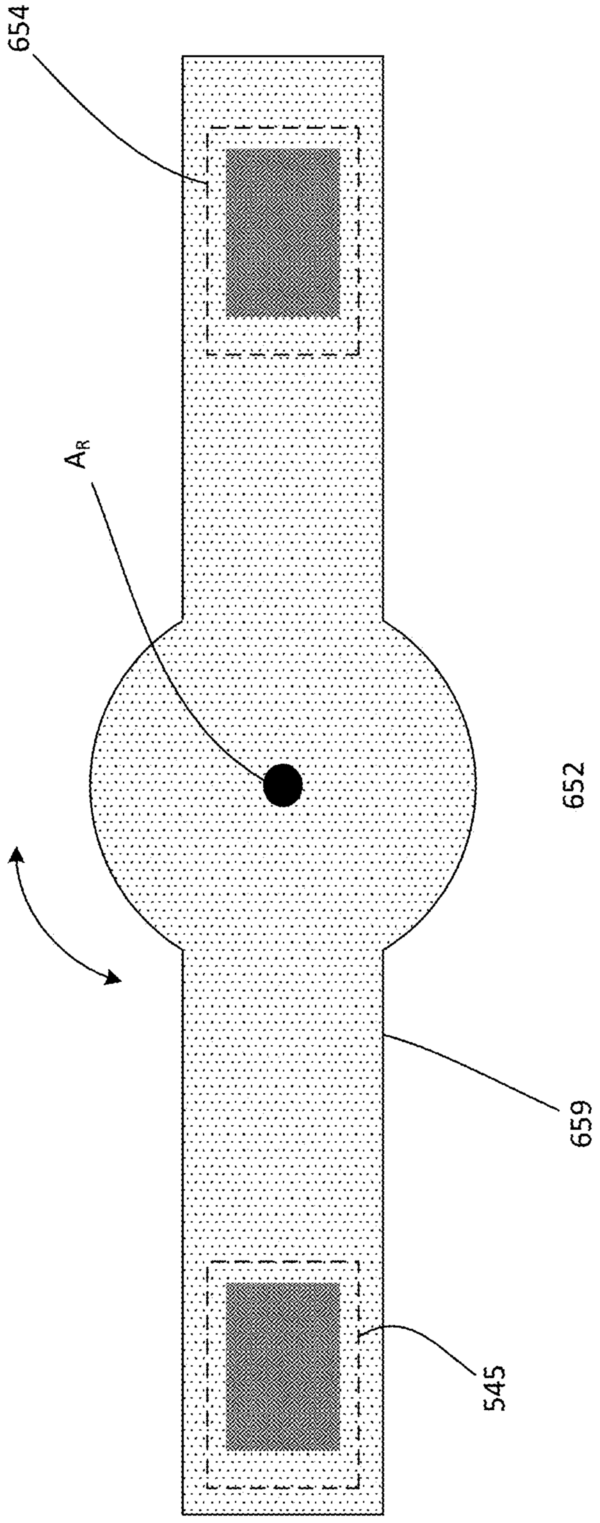

FIGS. 6*c*-6*d* show simplified side and top views of a lamination processing unit 652 of the lamination module. The processing unit includes a processing base 659. The processing base includes a central portion and extension arms for accommodating different processing units. For example, the central portion is configured to rotate about an axis of rotation $A_R$. The axis of rotation $A_R$, in one embodiment, is perpendicular to the center of the lamination chuck table.

In one embodiment, the processing unit includes first and second extension arms for accommodating the laminator unit 545 and the cutter unit 654. The lengths of the arms are sufficient to ensure the operation of the processing unit. In the case of two extension arms, they are opposing extension arms to maintain rotational balance when the processing base is rotated. If more arms are needed, they may be arranged to provide rotational balance. Of course, fine adjustments may be performed to ensure rotational balance with the processing unit mounted thereto.

FIGS. 7*a*-7*e* show simplified side views of a ring removal module 760 depicting a separation process. The ring removal module includes a ring removal positioning unit (not shown), a ring removal head unit 772, a ring removal chuck table unit 763, a ring removal assembly lock unit (not shown), a ring separator unit 765 and a ring removal output transfer unit (not shown). Providing the ring removal unit with other units may also be useful.

Figure 7A:
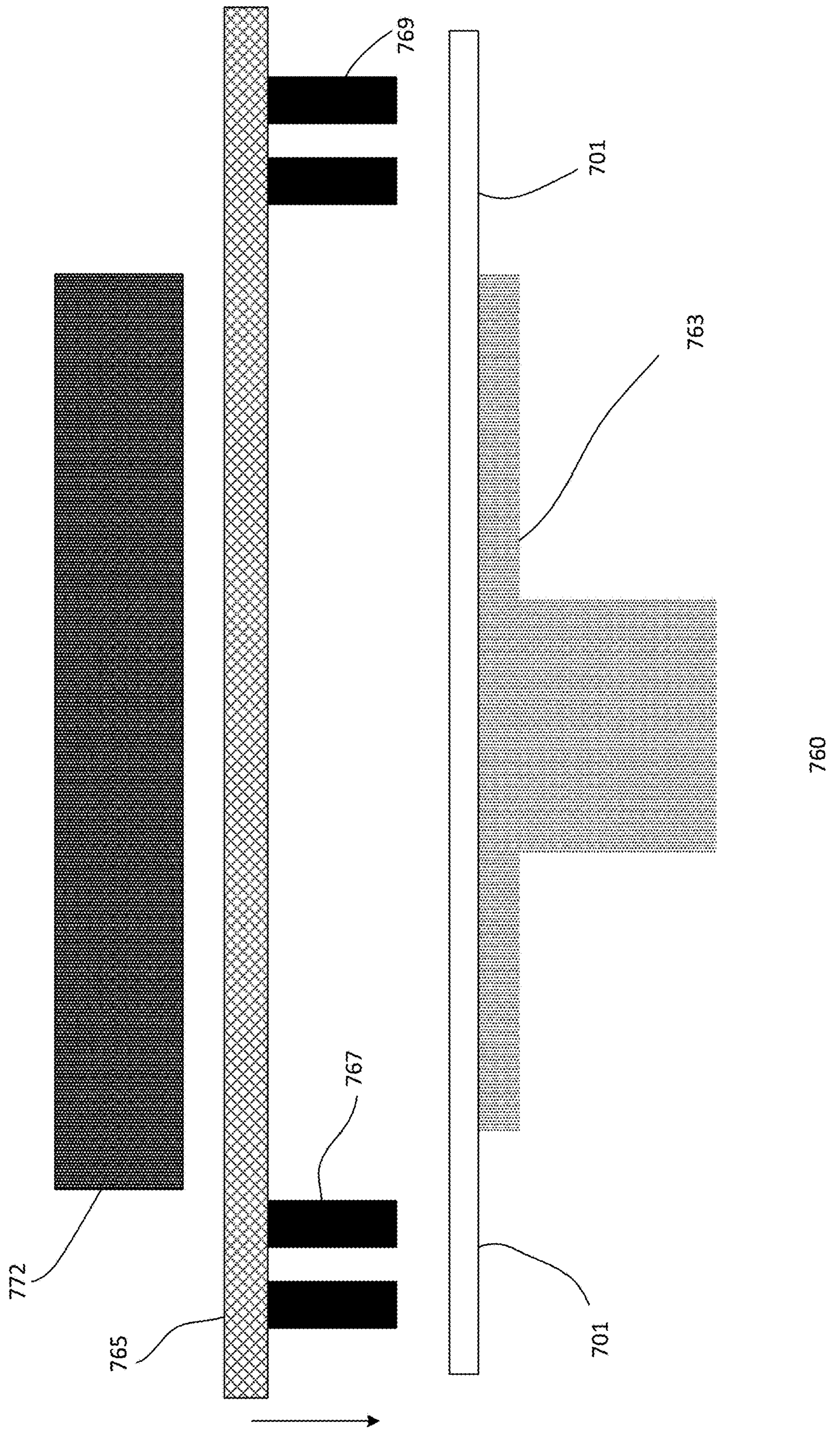
FIGS. 7*a*-7*e* show simplified side views of an embodiment of a ring removal module removing the primary ring from the adaptor ring and wafer.

Referring to FIG. 7*a*, the ring removal positioning unit positions a cut processed wafer adaptor ring assembly 701 on the ring removal chuck table unit 763 after cutting by, for example, the cutter unit of the lamination module. The ring removal chuck table has a diameter which is sufficient to ensure that the adaptor wafer ring with the wafer is separated from the primary wafer ring. For example, the ring removal chuck table is the same size or slightly larger than the adaptor wafer ring but smaller than the primary wafer ring. Once in position, the ring removal lock unit locks the wafer assembly in place.

The ring separator unit 765 moves downwards (as indicated by the arrow) and is positioned on the wafer assembly. The ring separator unit includes primary ring posts 769 and adhesive sheet posts 767 mounted on a ring separator support. The posts are distributed throughout the ring separator support and configured to hold the primary wafer ring and the adhesive sheet between the primary wafer ring and adaptor wafer ring in position during separation. For example, the primary ring posts are arranged in an outer circular arrangement and hold the primary wafer ring in position while the adhesive sheet posts are arranged in an inner circular arrangement to hold the adhesive sheet between the primary wafer ring and adaptor wafer ring in position. The ring removal head unit 772 remains in an unengaged position.

Figure 7B:
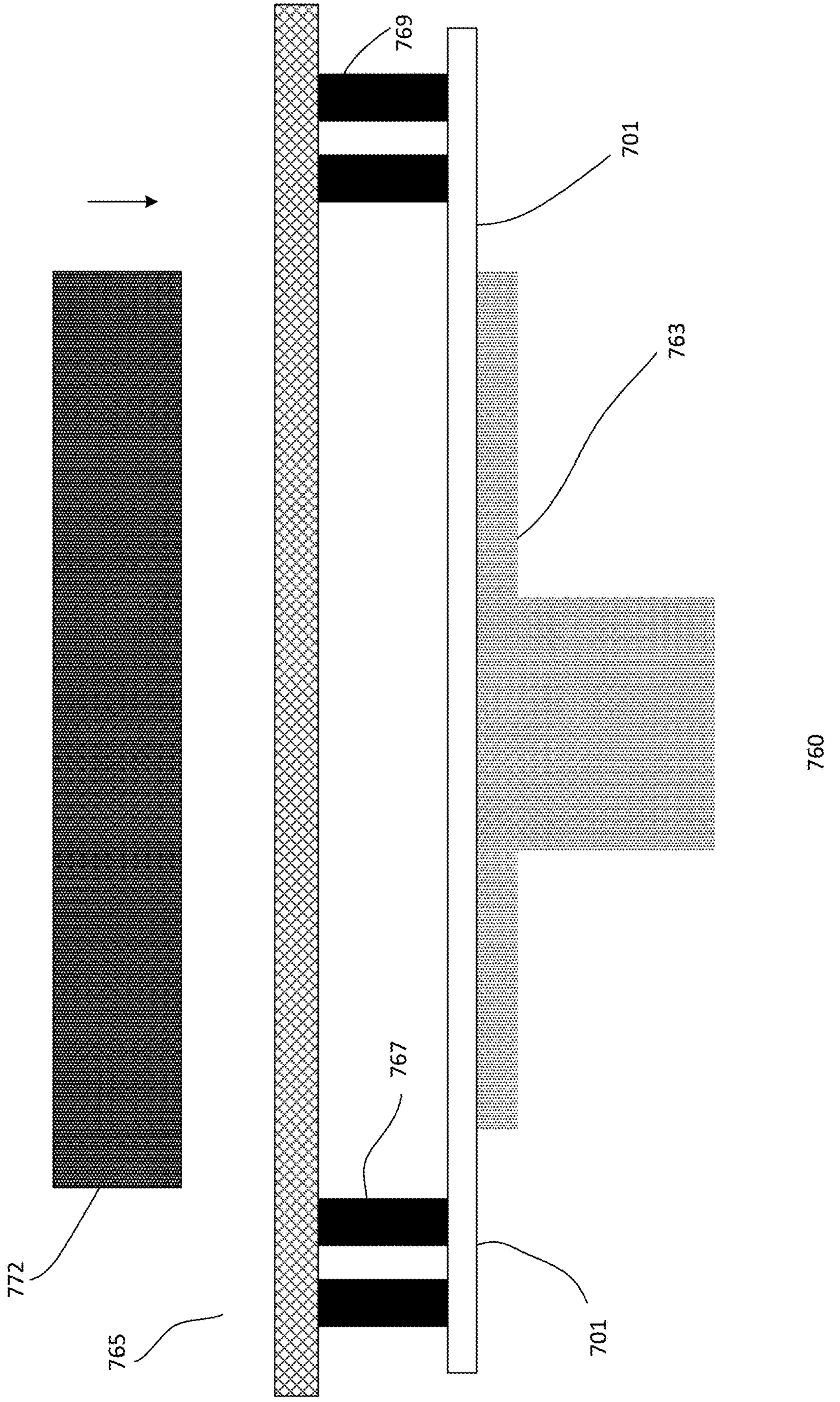
Figure 7C:
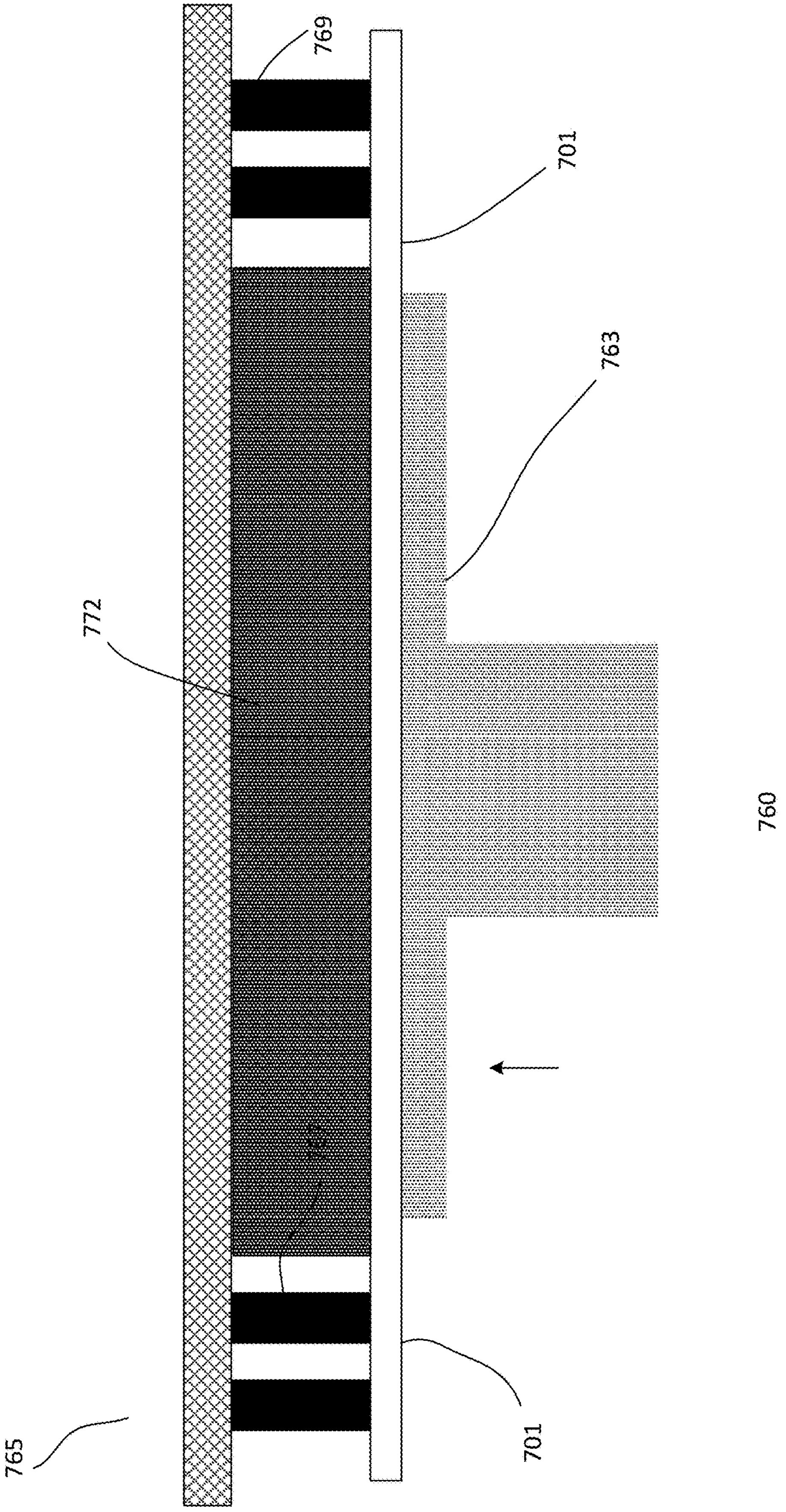

In FIG. 7*b*, the ring separator unit is engaged, with the primary ring posts 769 contacting the primary wafer ring and the adhesive sheet posts 767 contacting the adhesive sheet between the primary wafer ring and the adaptor wafer ring. Once the ring separator unit is engaged, the ring removal head unit 772 engages. For example, the head unit moves downwards to press against the adaptor ring assembly with the diced wafer, as shown in FIG. 7*c*.

Figure 7D:
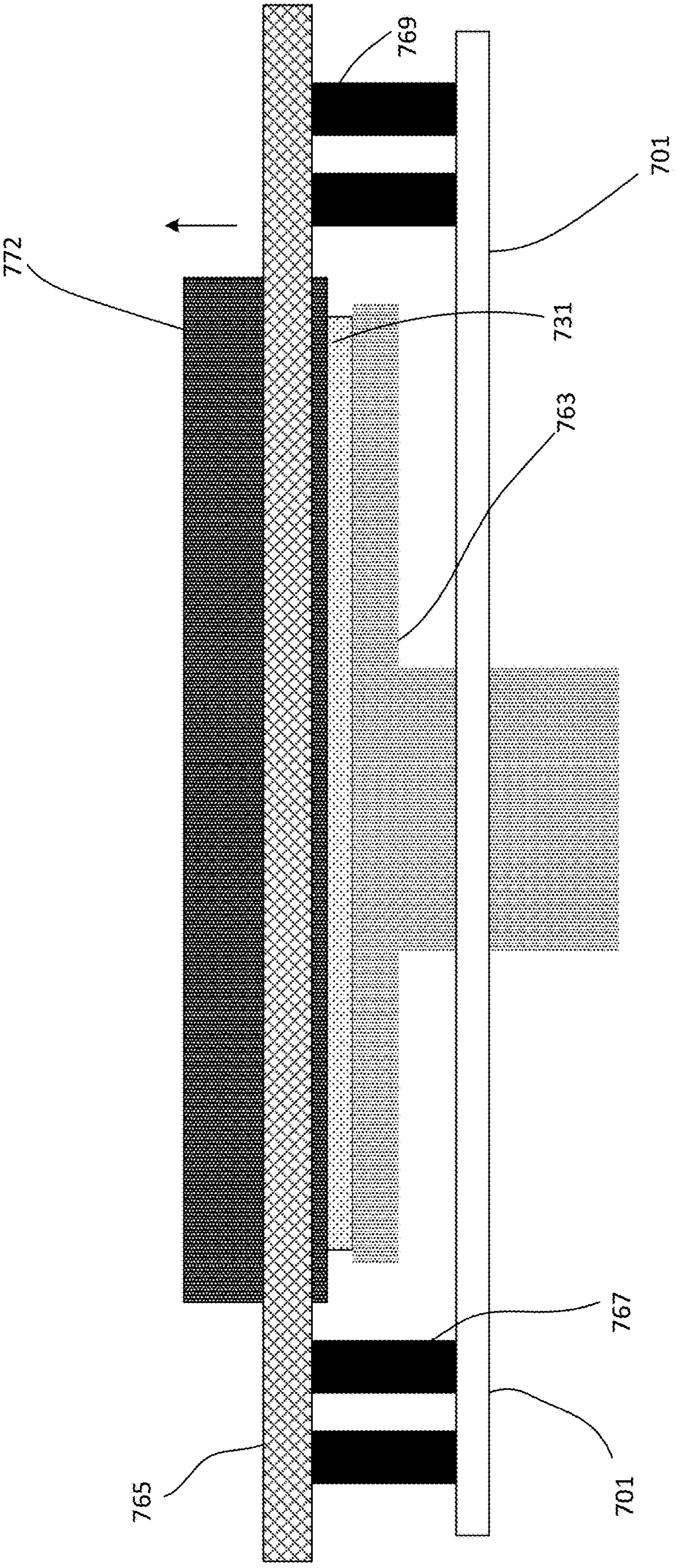
Figure 7E:
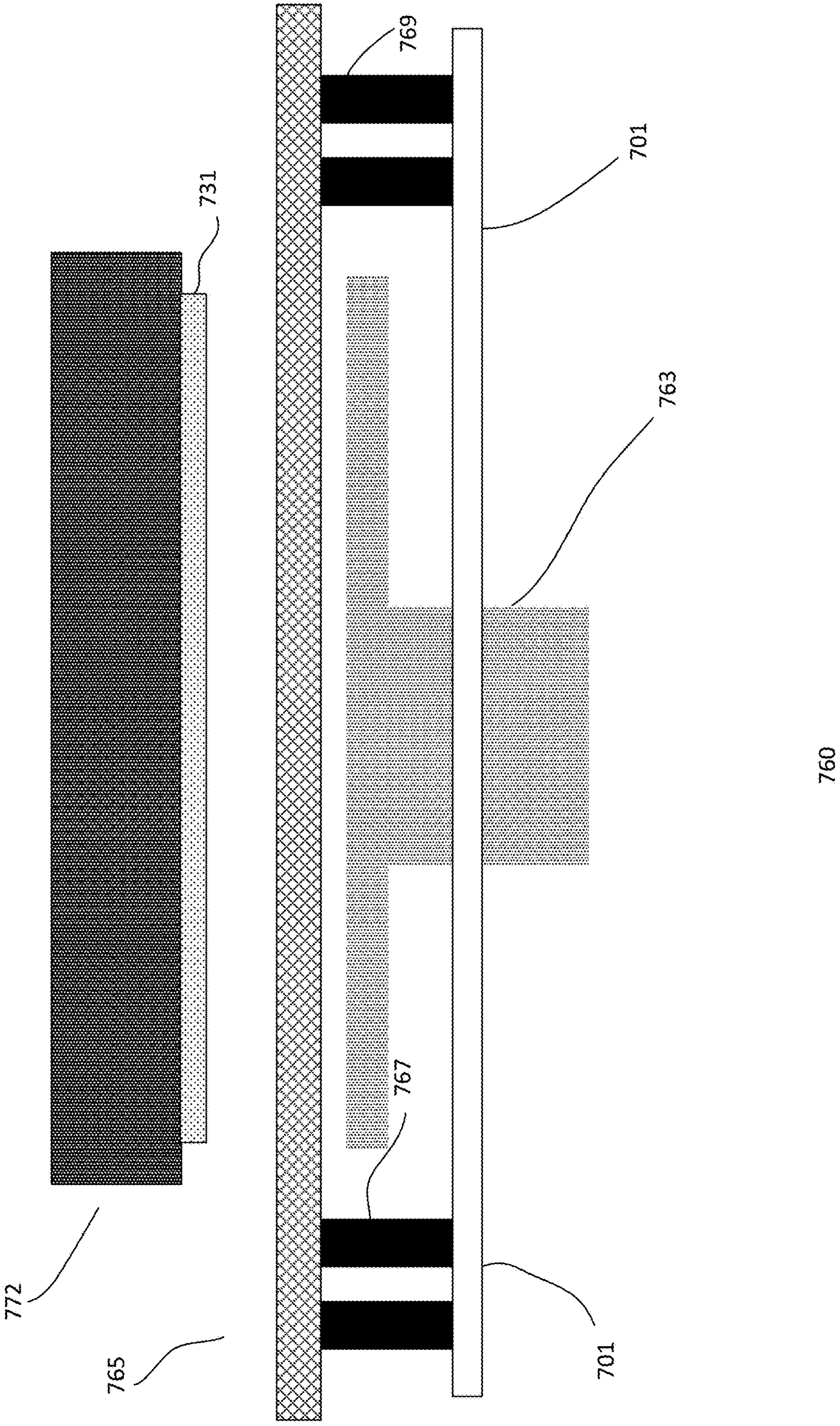

In FIG. 7*d*, the separation process commences. In one embodiment, the separation process includes elevating the ring removal chuck table 763 with the engaged ring removal head unit 772, as indicated by the arrow. This separates the adaptor ring assembly 731 from the primary ring. For example, the posts of the separator unit maintain the primary wafer ring and the adhesive sheet between the primary wafer ring and adaptor wafer ring in position while the chuck table separates the adaptor ring assembly therefrom. As shown in FIG. 7*e*, the ring removal head unit removes the adaptor ring assembly. For example, the adaptor ring assembly transfers the adaptor ring assembly to the adaptor ring assembly output module for further processing.

Figure 7F:
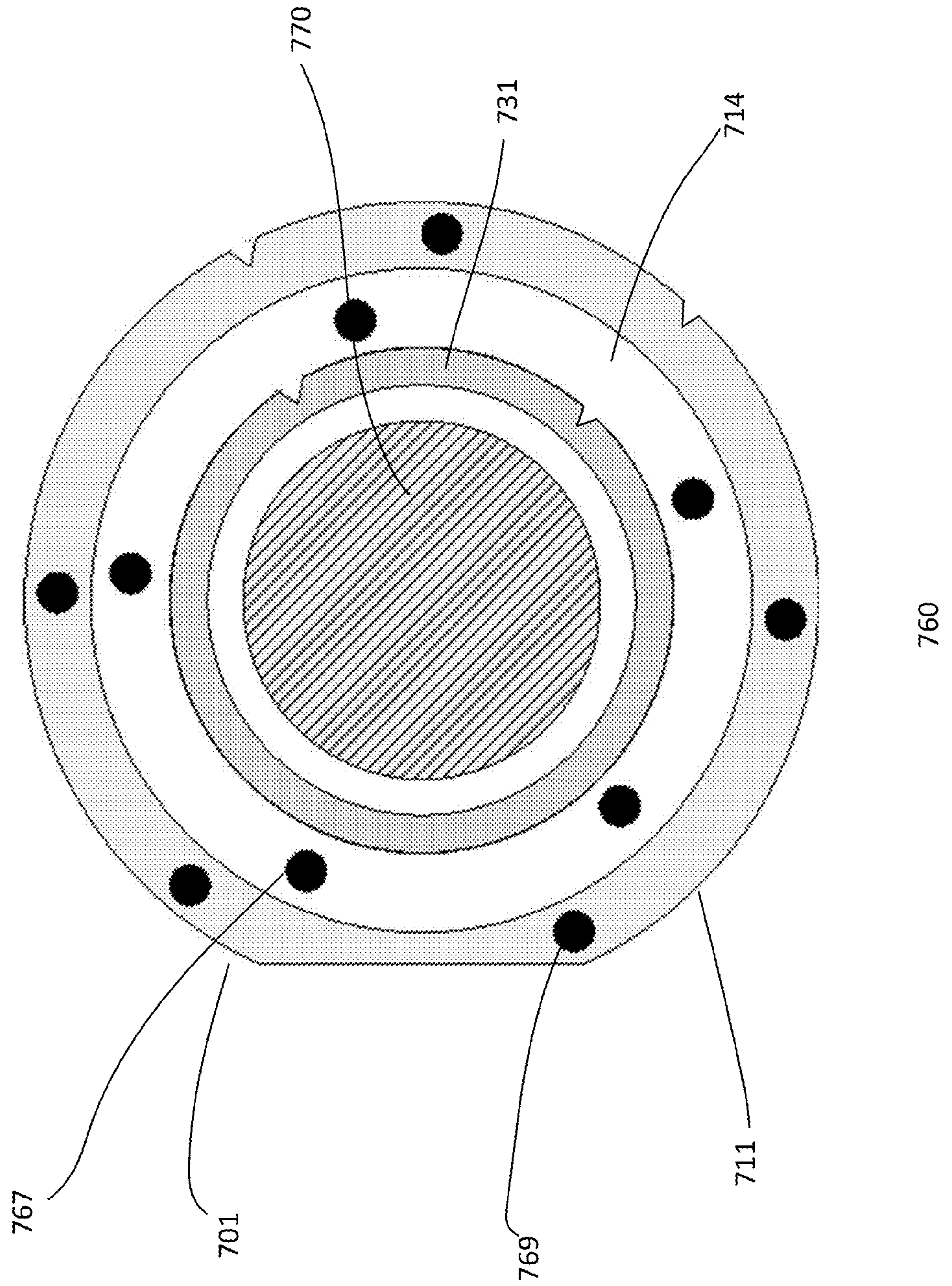
FIG. 7*f* shows a simplified top view of an embodiment of a ring removal module.

FIG. 7*f* shows a simplified top view of an embodiment of a ring removal module 760. As shown, a cut wafer adaptor ring assembly 701 includes a primary wafer ring 711, a cut adhesive sheet 714, an adaptor wafer ring 731 and a diced wafer 770. The ring separator head includes primary ring posts 769 distributed in a circular arrangement and contacting the primary wafer ring and adhesive sheet posts 767 distributed in a circular arrangement and contacting the adhesive sheet between the primary wafer ring and adaptor wafer ring. This enables the separating of the adaptor ring assembly from the primary ring assembly when the removal ring chuck table and head are elevated.

Figure 8:
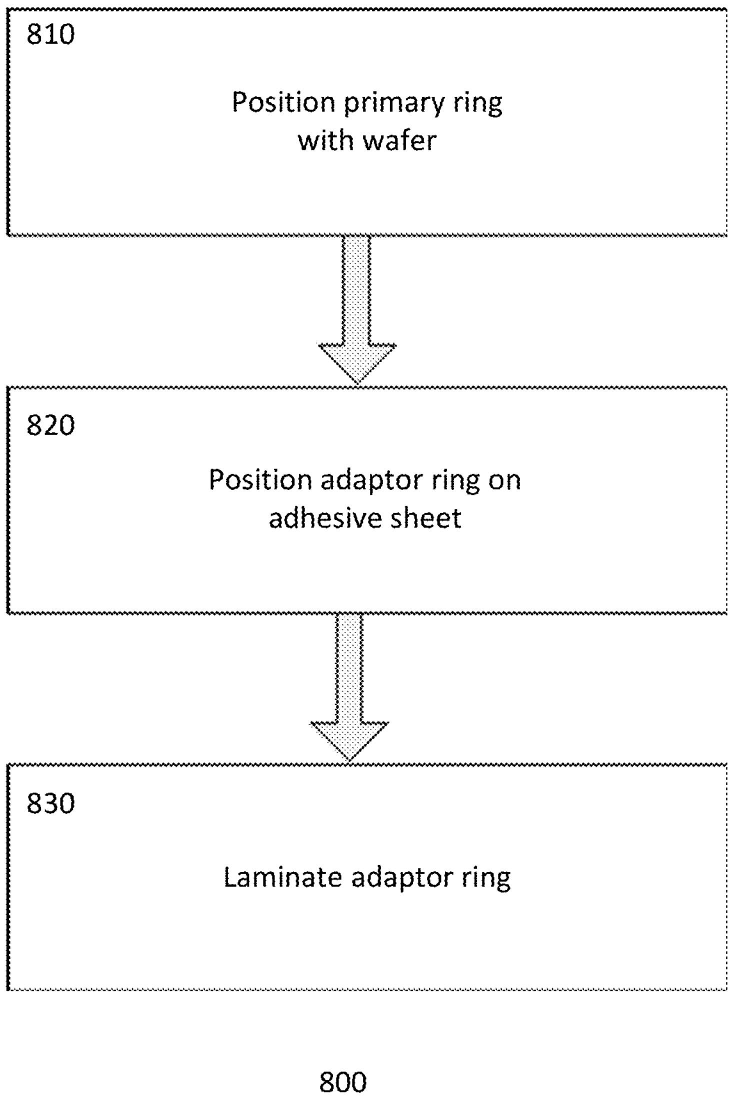
FIG. 8 shows an embodiment of a process flow for laminating an adaptor ring on a primary ring with a wafer.

FIG. 8 shows an embodiment of a process flow 800 for laminating an adaptor ring on a primary wafer ring with a wafer. At 810, a position module having an assembled primary wafer ring assembly which is locked in position on a position chuck table unit is provided. For example, a ring assembly position module receives an assembled primary wafer ring assembly and positions it on the position chuck table unit followed by the position lock unit locking the primary wafer ring assembly in position.

At 820, the position head module picks up an adaptor wafer ring and places it in position on the primary ring assembly module. For example, the adaptor wafer ring is placed in position on the adhesive sheet between the primary wafer ring and the wafer of the primary wafer ring assembly. This forms a wafer adaptor ring assembly.

The wafer adaptor ring assembly, at 830, is laminated. For example, the wafer adaptor ring assembly is transferred to the lamination module. The lamination module laminates the adaptor wafer ring to the adhesive sheet. The lamination process, in one embedment, activates the adhesive and smoothens the adhesive sheet under the adaptor wafer ring, completing the wafer adaptor ring assembly.

Figure 9A:
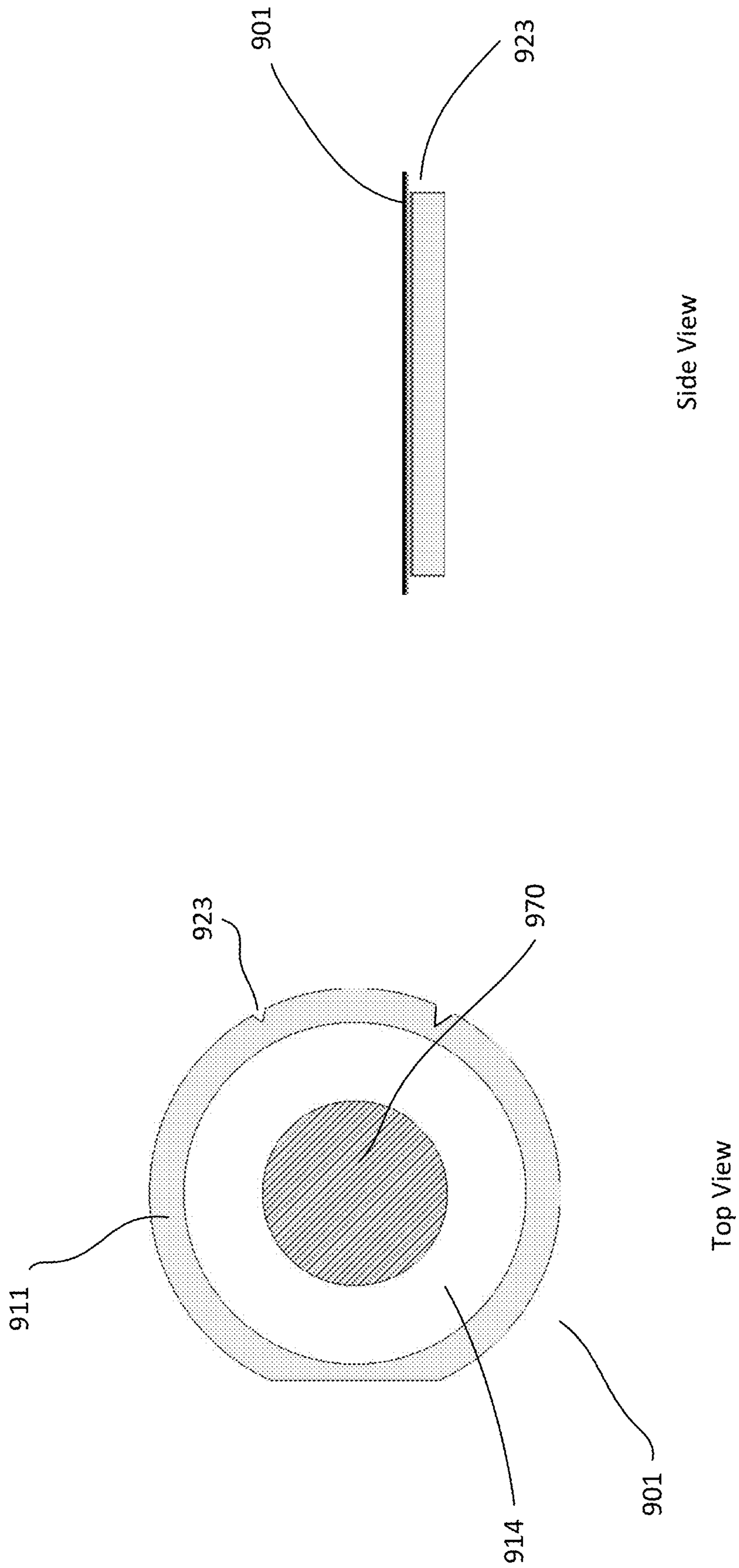
FIGS. 9*a*-9*c* show various simplified (side and top) views depicting an embodiment of a process for positioning an adaptor ring on a primary ring with a wafer.
Figure 9B:
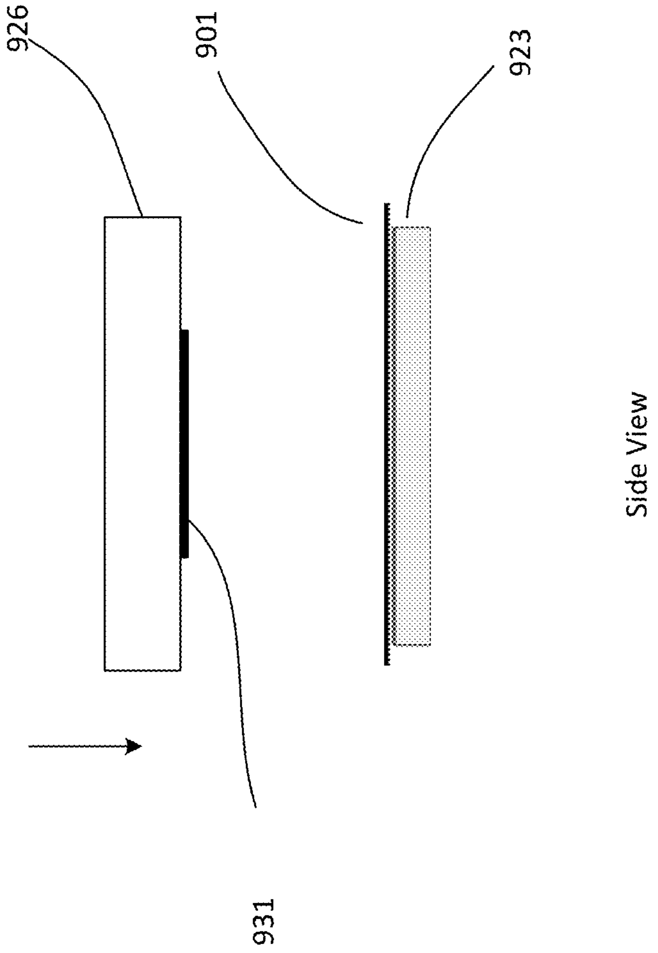
Figure 9C:
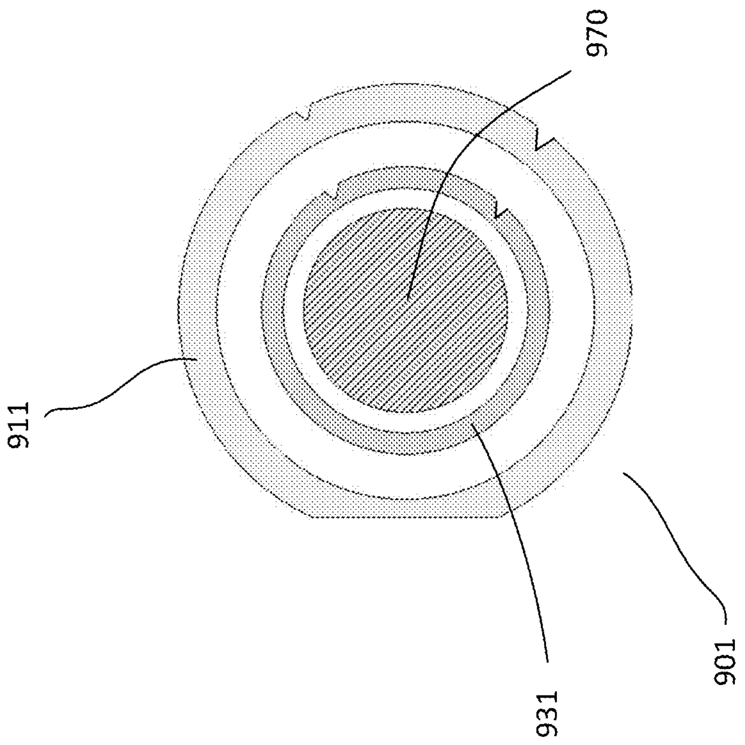

FIGS. 9*a*-9*c* show top and side views of a position module depicting the process for forming a wafer adaptor ring assembly prior to lamination. Referring to FIG. 9*a*, an assembled primary wafer ring assembly 901 is provided. The assembled primary wafer ring assembly includes a primary wafer ring 911 with an adhesive sheet 914 laminated to a bottom surface thereof. A wafer 970 is laminated to the adhesive sheet within the opening of the primary wafer ring. For example, the wafer is aligned within the opening of the primary and laminated to the adhesive sheet. The primary wafer ring assembly is positioned on the position module chuck table unit 923. Once positioned, it is locked into position.

In FIG. 9*b*, a position head unit 926 picks up an adaptor wafer ring 931. The position head aligns the adaptor wafer ring to the assembled primary wafer ring assembly 901 on the position module chuck head unit 923. When in position, the adaptor wafer ring is placed on the adhesive sheet of the primary wafer ring assembly between the primary wafer ring and wafer, as shown in FIG. 9*c*. The primary wafer ring assembly is now ready for lamination.

Figure 10:
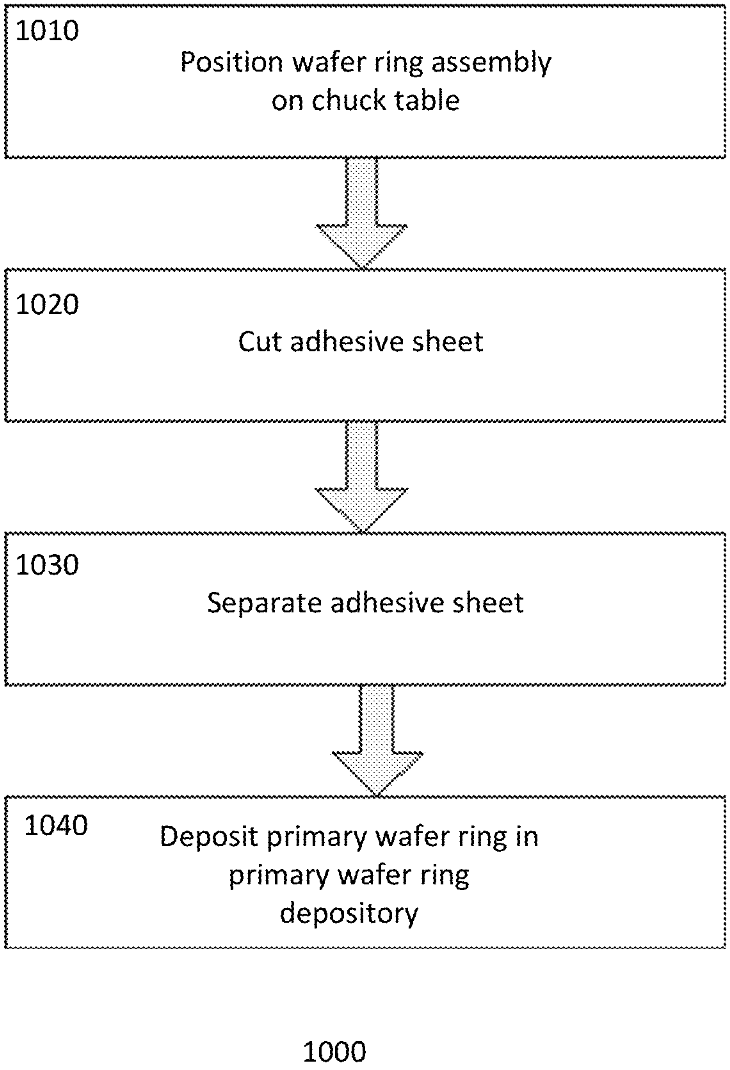
FIG. 10 shows an embodiment of a process flow for separating the adaptor ring and wafer from the primary wafer ring.

FIG. 10 shows an embodiment of a process flow1000 for separating the adaptor wafer ring and wafer from the primary wafer ring. At 1010, a processed wafer adaptor ring assembly is provided for cutting. For example, the processed wafer adaptor ring assembly includes a diced wafer. In one embodiment, the processed wafer adaptor ring assembly is provided to the lamination module for cutting the adhesive sheet in preparation for separating the adaptor ring assembly with the diced wafer from the primary ring assembly. In one embodiment, the processed wafer adaptor ring assembly is positioned on the lamination chuck table and locked into position. The lamination head unit is lowered onto the lamination chuck table unit. The lamination head unit presses against, for example, the adaptor wafer ring and wafer of the processed wafer adaptor assembly.

In one embodiment, at 1020, the cutter unit of the lamination module is engaged. For example, the cutter of the cutter unit is moved upwards to press against the adhesive sheet below the adaptor wafer ring. The cutter is rotated around the adaptor ring track to cut the adhesive sheet. This results in a cut processed wafer adaptor ring assembly. Although the adhesive sheet is cut, the assembly remains in contact. For example, the adhesive of the adhesive sheets maintains the assembly in contact.

The cut processed wafer adaptor ring assembly is prepared for separation. In one embodiment, the cut processed wafer adaptor ring assembly is transferred from the lamination module to the ring removal module at 1030.

Separation of the wafer adaptor ring assembly includes positioning and locking the processed wafer adaptor ring assembly onto the ring removal chuck table by the ring removal lock unit. The ring separator unit of the ring removal module moves downwards, holding the primary ring in position by primary ring posts and the adhesive sheet between the primary wafer ring and adaptor wafer ring by adhesive sheet posts. The ring removal head unit is engaged, pressing the adaptor ring assembly against the ring removal chuck table unit. The ring removal chuck table is elevated with the ring separator head unit, separating the adaptor ring assembly from the primary ring assembly. After separation, the ring removal chuck table is retracted. The ring removal head holds the wafer adaptor ring assembly while the primary wafer ring is maintained in position on the ring removal module.

At 1040, the primary ring assembly is transferred to the primary ring repository. Subsequently, the primary ring assembly is cleaned for reuse. The adaptor ring assembly is transferred to the adaptor ring output assembly for further processing.

Figure 11A:
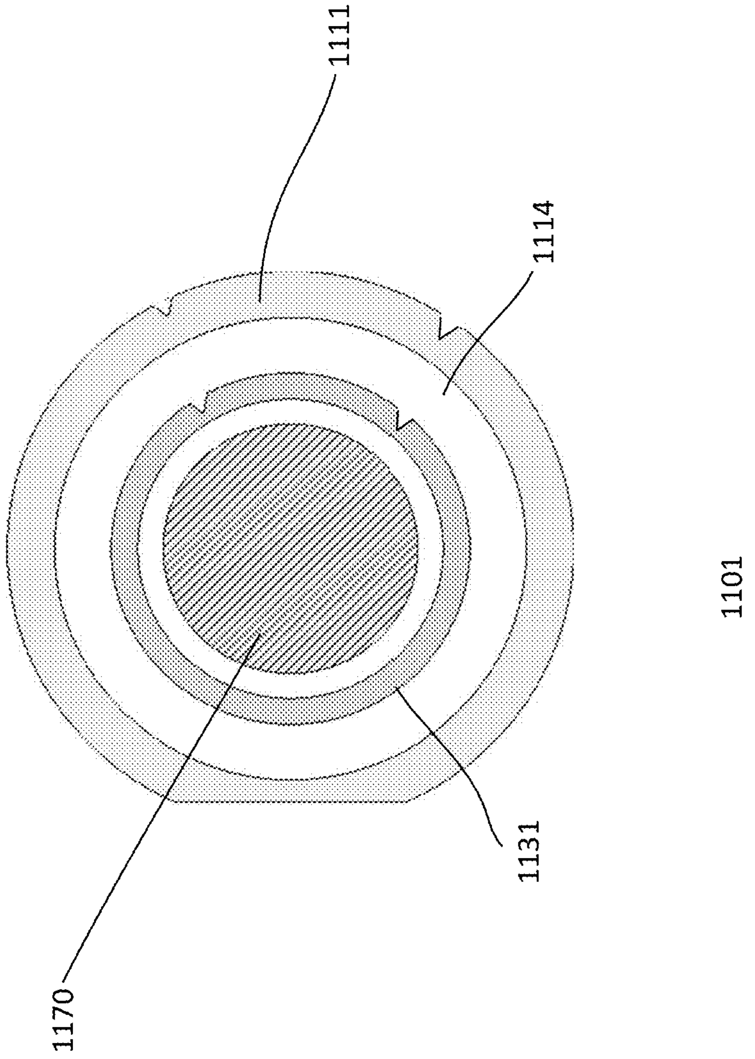
FIGS. 11*a*-11*b* show simplified top views of separating the adaptor ring and wafer from the primary wafer ring.
Figure 11B:
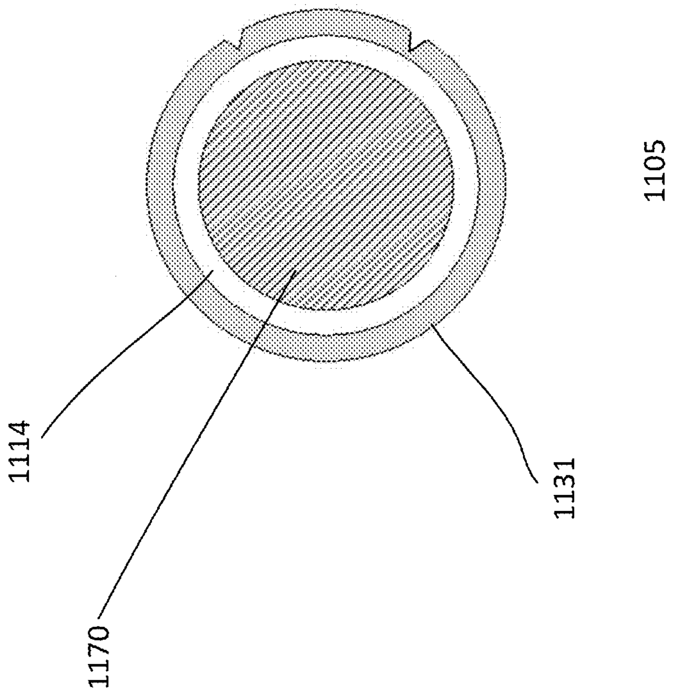

FIGS. 11*a*-11*b* shows simplified top views of a process for separating the adaptor ring assembly from the primary wafer ring. Referring to FIG. 11*a*, a cut processed wafer adaptor ring assembly 1101 is shown. The cut processed wafer adaptor assembly includes a primary wafer ring 1111, an adhesive sheet 1114 laminated to a bottom surface thereof, an adaptor wafer ring 1131 and a diced wafer 1170 laminated to the adhesive sheet. The adhesive sheet is cut under the adaptor ring. In FIG. 11*b*, an adaptor ring assembly 1105 is shown. The adaptor ring assembly includes the adaptor wafer ring 1131 with the adhesive sheet 1114 and diced wafer 1170 laminated thereto.

Figure 12:
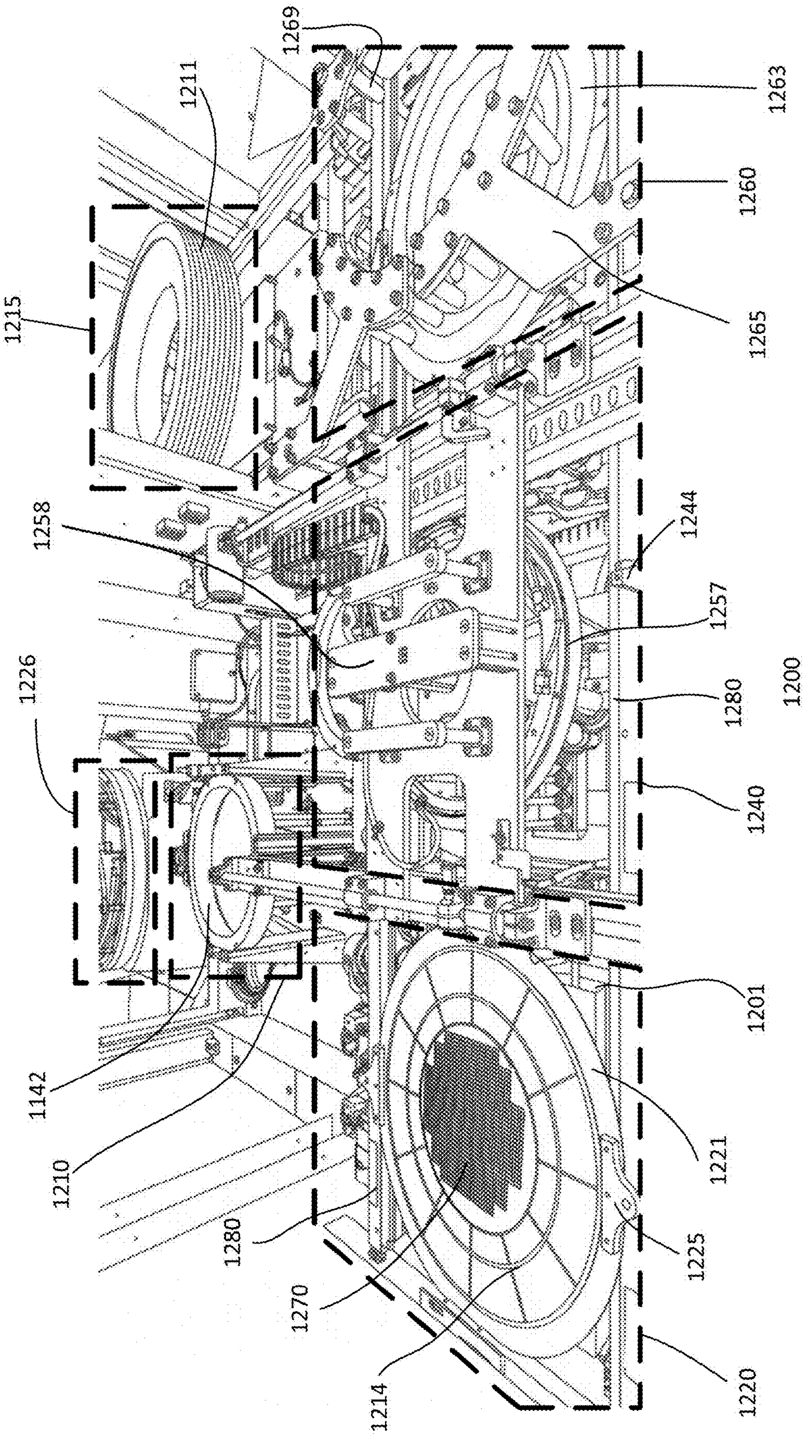
FIG. 12 shows an embodiment of a system for adapting a wafer for plasma dicing.

FIG. 12 shows a prototype of a system 1200 for assembling and disassembling a wafer adaptor ring assembly before and after plasma dicing. As shown, the system includes an adaptor ring repository 1210, a primary wafer ring with wafer input module 1213, a position module 1220, a lamination module 1240, a ring removal module 1260 and a primary wafer repository module 1215. The system may also include other modules, such as a processed wafer adaptor ring assembly input module, an adaptor ring assembly output module and a laminated wafer adaptor assembly output module.

In one embodiment, the system includes an input subsystem, a processing subsystem and an output system. The input subsystem may include the wafer input module, the adaptor ring repository module and the processed wafer adaptor ring assembly input module. The processing subsystem includes the position module, the lamination module and the ring removal module. As for the output subsystem, it includes the primary wafer ring repository module, the adaptor ring assembly output module and the laminated wafer adaptor assembly output module. In one embodiment, the input system is in communication with the processing subsystem through the position module and the output subsystem is in communication with the processing subsystem through the ring removal module. Other configurations of the subsystems may also be useful.

In one embodiment, the adaptor wafer ring repository module and the primary wafer ring with wafer module provide input material. In one embodiment, the adaptor ring repository module contains a stack of adaptor wafer rings 1142. As for the primary wafer ring with wafer module, it provides a primary ring assembly 1201 as input material for the position module. The primary wafer ring assembly includes a primary wafer ring 1211 with an adhesive sheet 1214 laminated to a bottom surface thereof. A wafer 1270 is laminated to the adhesive sheet.

The position module is configured to receive the assembled primary wafer ring assembly. The position module, in one embodiment, includes a position assembly positioning unit 1280, a position head unit 1226, a position chuck table unit, a position lock unit 1225 and a position output transfer unit. Providing the position module with other units may also be useful.

The position assembly positioning unit is configured to receive the assembled primary ring assembly and position it on the position chuck table unit. In one embodiment, the position assembly positioning unit includes first and second belts which translate the primary assembly into position. Vacuum pressure is applied to hold the primary ring assembly in position on the position chuck table. The position lock unit is engaged to lock the primary ring assembly in position. In one embodiment, the position lock unit includes first and second locks or retainers on opposite sides of the position module.

In one embodiment, the position head unit picks up a wafer adaptor ring from the wafer adaptor ring repository module using, for example, vacuum pressure. The head unit positions the adaptor ring on the adhesive sheet of the primary ring assembly between the primary wafer ring and wafer. The position head unit releases the adaptor wafer ring and retracts away from the wafer adaptor ring assembly.

The position lock unit disengages, freeing the wafer adaptor ring assembly. The position output transfer unit transfers the wafer adaptor ring assembly to the lamination module for further processing. In one embodiment, the output transfer unit is a part of the position assembly positioning unit. For example, the first and second belts form an integrated position assembly positioning unit and position output transfer unit.

The lamination module, in one embodiment, includes a lamination assembly positioning unit 1281, a lamination module chuck table, a lamination head unit 1257, a lamination head support unit 1258, a lamination lock unit 1244, a laminator unit, a cutter unit and a lamination output transfer unit. Providing the lamination module with other units may also be useful.

For lamination, the wafer adaptor ring assembly from the position module is positioned on the lamination chuck table by the lamination assembly positioning unit. In one embodiment, the lamination assembly position unit includes first and second belts which translate the wafer adaptor ring assembly into position on the lamination chuck table. The chuck table has a table diameter which is smaller than the diameter of the inner edge of the adaptor wafer ring. When the wafer adaptor ring assembly is positioned on the lamination chuck table, the adaptor wafer ring is not on the table. Vacuum pressure is applied to hold the wafer adaptor ring assembly in position on the lamination chuck table.

The lamination lock unit is engaged to lock the wafer adaptor ring assembly in position. In one embodiment, the lamination lock unit includes first and second locks or retainers on opposite sides of the lamination module. The lamination head unit moves into position, pressing the wafer adaptor ring assembly against the table. As for the lamination head unit, it covers the adaptor wafer ring and wafer of the wafer adaptor ring assembly.

The laminator unit engages, pressing the lamination roller to the adhesive sheet under the adaptor wafer ring. The laminator unit rotates around an adaptor ring track which follows or tracks the adaptor wafer ring. The laminator unit is configured to activate the adhesive and smoothen out the adhesive sheet, laminating the adaptor wafer ring to the adhesive sheet. After lamination, the assembling of the wafer adaptor ring assembly is completed. The lamination head releases the laminated wafer adaptor ring assembly and is retracted. The lamination lock unit disengages, freeing the laminated wafer adaptor ring assembly.

The laminated wafer adaptor ring assembly is transferred out of the system for processing, such as plasma dicing. In one embodiment, the lamination output transfer unit transfers the laminated wafer adaptor ring assembly from the lamination module for further processing. In one embodiment, the lamination output transfer unit is a part of the lamination assembly positioning unit. For example, the first and second belts form an integrated lamination assembly positioning unit and lamination output transfer unit.

The lamination output unit, in one embodiment, transfers the laminated wafer adaptor ring assembly to the laminated wafer adaptor ring assembly output module. For example, the laminated wafer adaptor ring assembly is transferred to the ring removal module which then transfers it to the laminated wafer adaptor ring assembly output module. The laminated wafer adaptor ring assembly output module may be configured to store a stack of laminated wafer adaptor ring assemblies. When the laminated wafer adaptor ring assembly output module is full, the laminated wafer adaptor ring assemblies are transferred to the plasma dicer for dicing. For example, the laminated wafer ring assemblies are stored in a container which is transferred to the plasma dicer.

After laminated wafer adaptor ring assemblies are processed by the plasma dicer, they are transferred to the processed wafer adaptor ring assembly input module. In one embodiment, the processed wafer adaptor ring assembly input module feeds a laminated adaptor ring assembly for processing. In one embodiment, the processed ring assembly input module feeds a laminated wafer adaptor ring assembly for separating the adaptor ring assembly with the diced wafer from the primary ring assembly. For example, the processing ring assembly is provided to the lamination module to cut the adhesive sheet under the adaptor wafer ring and then to the ring removal module to separate the adaptor ring assembly from the primary ring assembly.

In one embodiment, the system can be configured for performing a lamination process or a ring removal process. In one embodiment, the input module includes a primary input unit and a secondary input unit. The input module can be configured to provide the necessary materials for the system to perform a lamination process or a ring removal process. For example, when the system is configured to perform the lamination process, the primary input unit is configured to provide a primary ring assembly to the position module while the secondary input unit provides an adaptor ring for positioning on the primary ring assembly. To configure the system to perform the ring removal process, the primary input unit is configured to provide a processed wafer adaptor ring assembly to the system for ring separation while the secondary input unit is inactive. For example, the primary input unit may be configured as the processed wafer adaptor ring assembly input unit or the primary wafer ring with wafer input unit, depending on what process the system is to perform. Other configurations of the input module may also be useful.

The ring removal process is similar to that described for the lamination process. For example, a processed wafer adaptor ring assembly is provided to the lamination module via the position module, locked into position followed by engaging the lamination head unit. The cutter unit is activated to cut the adhesive sheet under the adaptor ring. After the adhesive sheet is cut, the cut processed wafer adaptor ring assembly is transferred to the ring removal module.

The ring removal module includes a ring removal positioning unit 1282, a ring removal head unit, a ring removal chuck table unit, a ring removal assembly lock unit, a ring separator unit 1265 and a ring removal output transfer unit. Providing the ring removal module with other units may also be useful.

The ring removal positioning unit positions the cut processed wafer adaptor ring assembly on the ring removal chuck table unit. In one embodiment, the ring removal positioning unit includes first and second belts which translate the cut processed wafer adaptor ring assembly 1202 into position on the ring removal chuck table. The chuck table has a table diameter which is smaller than the diameter of the inner edge of the primary ring but larger than the outer edge of the adaptor ring. Vacuum pressure is applied to hold the cut processed wafer adaptor ring assembly in position on the lamination chuck table. Once in position, the ring removal lock unit locks the cut processed wafer assembly in place.

The ring separator unit is positioned on the wafer assembly. In one embodiment, primary ring separator posts 1269 are positioned on the primary wafer ring and adhesive sheet posts are positioned on the adhesive sheet between the primary wafer ring and adaptor wafer ring. The ring removal head unit is positioned on the wafer adaptor ring assembly. In one embodiment, the removal head unit covers the adaptor ring assembly. After the ring removal head unit is positioned on the adaptor ring assembly, the ring removal chuck table unit is moved upwards along with the ring removal head unit. This separates the adaptor ring assembly with the diced wafer from the primary ring assembly.

After separation, the ring removal lock unit disengages, freeing the primary ring assembly. The primary ring assembly is transferred to the primary ring repository. For example, a primary ring removal output transfer unit 1283 transfers the primary ring assembly to the primary ring repository. The primary ring removal output transfer unit, for example, includes first and second belts configured to transfer the primary ring assembly to the primary ring repository. The primary ring repository is configured to hold a stack of primary ring assemblies with the cut adhesive sheets. When the repository is full, the stack is transferred to remove the adhesive sheets, resulting in cleaned primary wafer rings for reuse.

As for the adaptor ring assembly, the ring removal chuck table releases the vacuum pressure and the ring removal head unit. Vacuum pressure from the ring removal head unit holds the adaptor ring assembly thereon and transfers it to the adaptor ring assembly output module. The adaptor ring assembly output module may store a stack of adaptor ring assemblies. When full, the stack of adaptor ring assemblies is transferred for subsequent processing, such as separating the dies of the diced wafer from the adhesive sheet and separating the adhesive sheet from the adaptor wafer ring, resulting in a clean adaptor ring for reuse.

In one embodiment, the output transfer unit and positioning unit of all the modules are integrated. For example, a single pair of belts for all the modules of the system. Other configurations of the output transfer and position units of the system may also be useful.

FIGS. 13*a*-13*e* illustrate a process flow 1300 for forming a wafer adaptor ring assembly by the prototype system 1200 of FIG. 12. Common elements may not be described or described in detail.

Figure 13A:
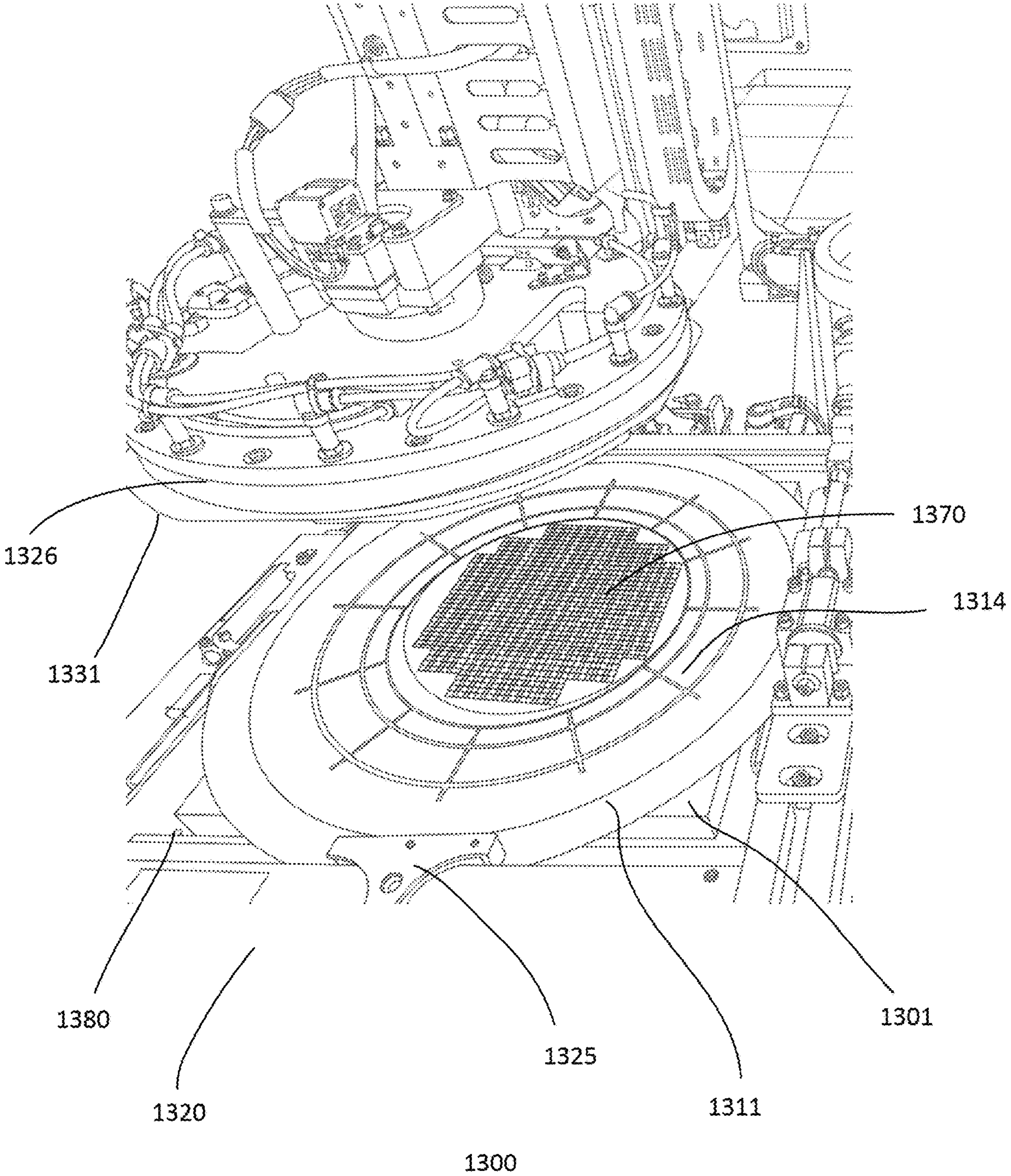
FIGS. 13*a*-13*e* show a process flow for positioning and laminating an adaptor ring on a primary wafer ring with a wafer by an embodiment of a system for adapting a wafer for plasma dicing.

Referring to FIG. 13*a*, the position module 1320 positions a primary ring assembly 1301 with a wafer 1370 on the position chuck table by the position assembly positioning unit 1380. When in position on the position chuck table, the position lock unit 1325 engages to lock the primary ring assembly in position. The position chuck table may preheat the adhesive sheet on the primary ring assembly. The position head unit 1326 picks up an adaptor ring 1331 from, for example, the adaptor ring repository.

Figure 13B:
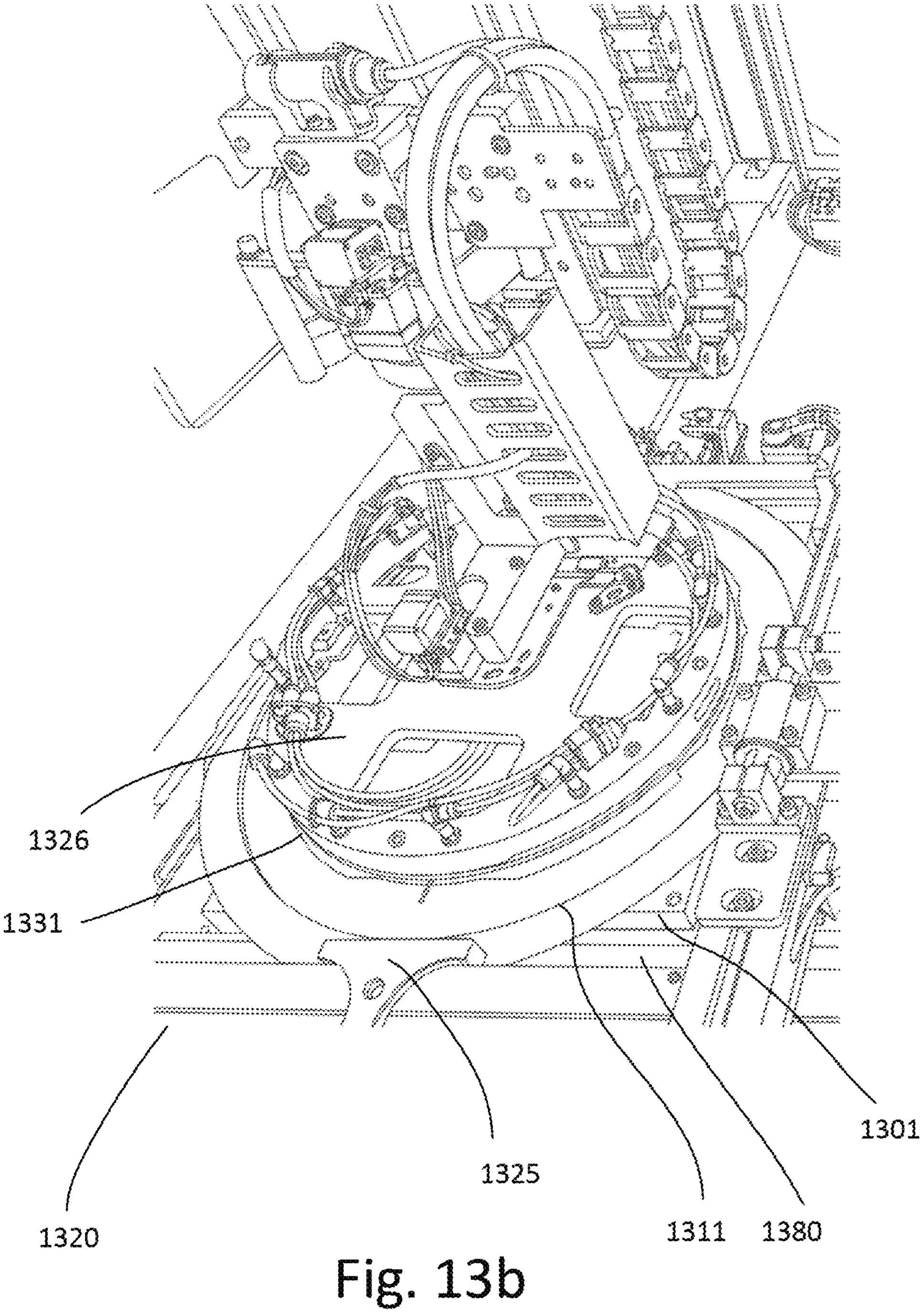

FIG. 13*b* shows the position head 1326 aligning the adaptor ring 1331 to the primary ring assembly 1301. For example, the adaptor ring is aligned between the primary ring 1311 and the wafer. When in position, the position head unit lowers and presses the adaptor ring onto the adhesive sheet of the primary ring assembly.

Figure 13C:
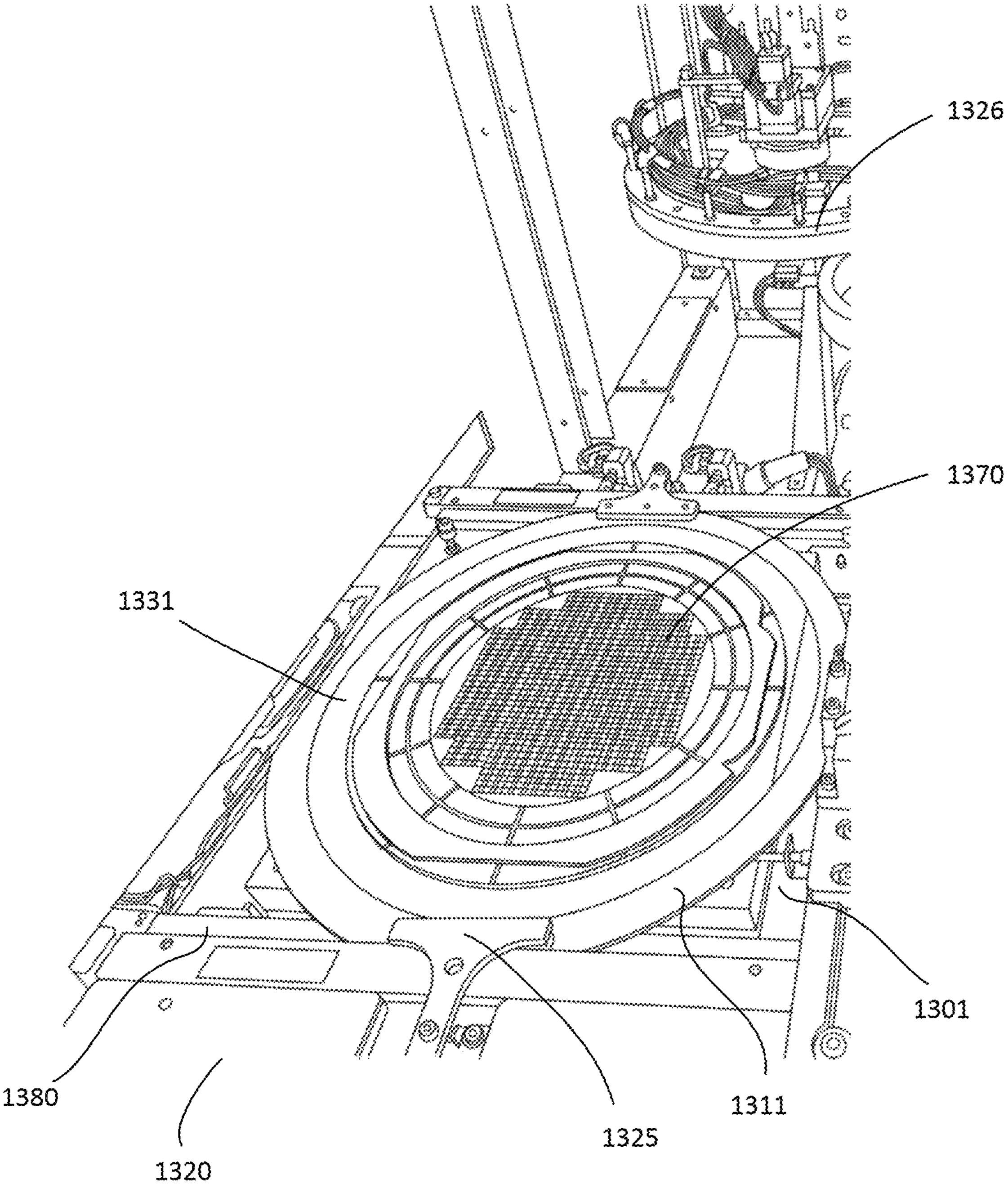

As shown in FIG. 13*c*, the position head releases the adaptor ring 1331. For example, vacuum pressure is released, freeing the adaptor ring. The position head is raised and moved away from the chuck table. This results in a wafer adaptor ring assembly on the chuck table. For example, the primary ring assembly 1301 with the wafer 1370 now includes the adaptor ring on the adhesive sheet between the primary ring 1311 and the wafer.

Figure 13D:
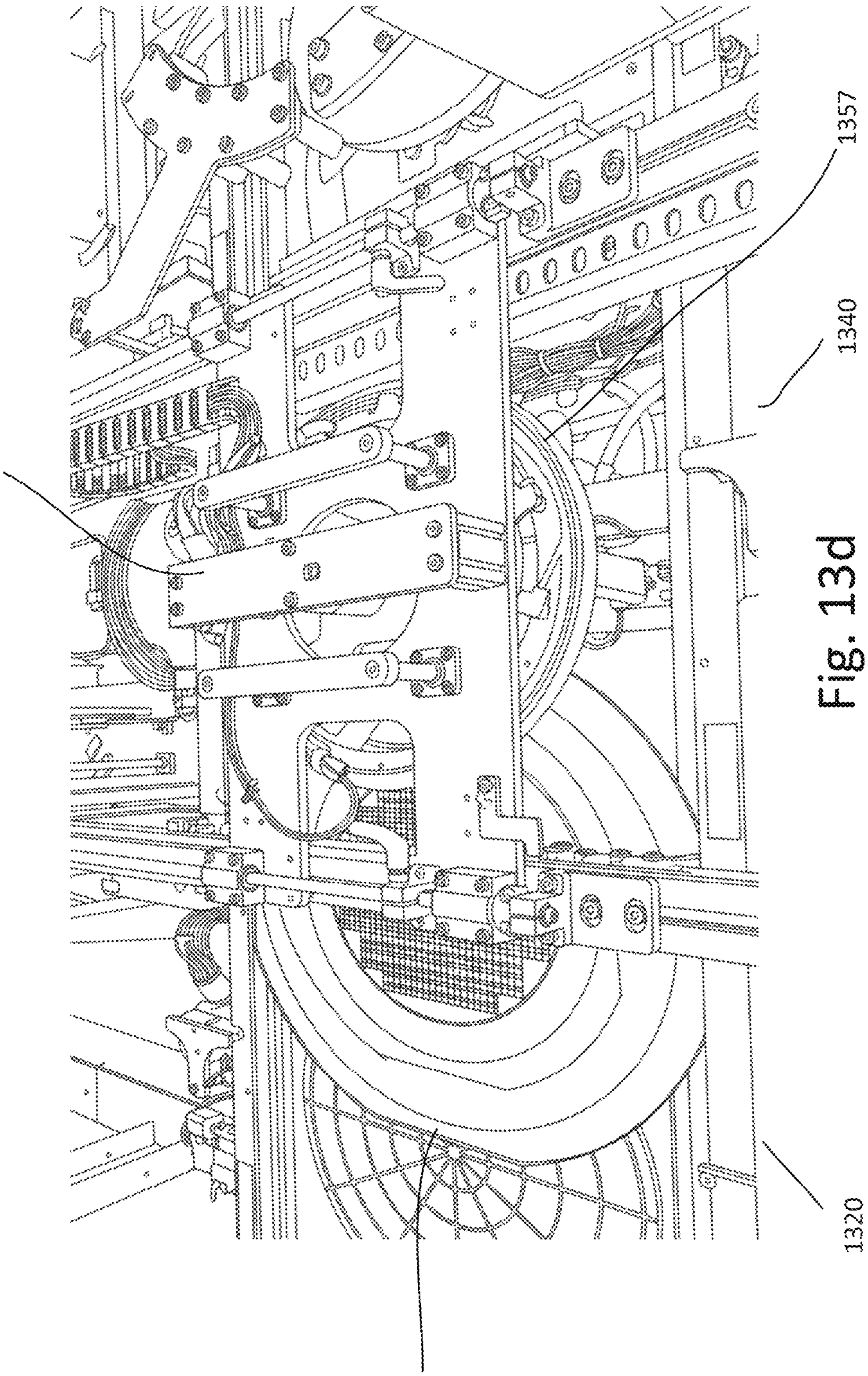

In FIG. 13*d*, the position lock unit is disengaged and the position output transfer unit transfers the wafer adaptor ring assembly to the lamination module 1340 for further processing. As shown, the output transfer unit is a part of the position assembly positioning unit.

Figure 13E:
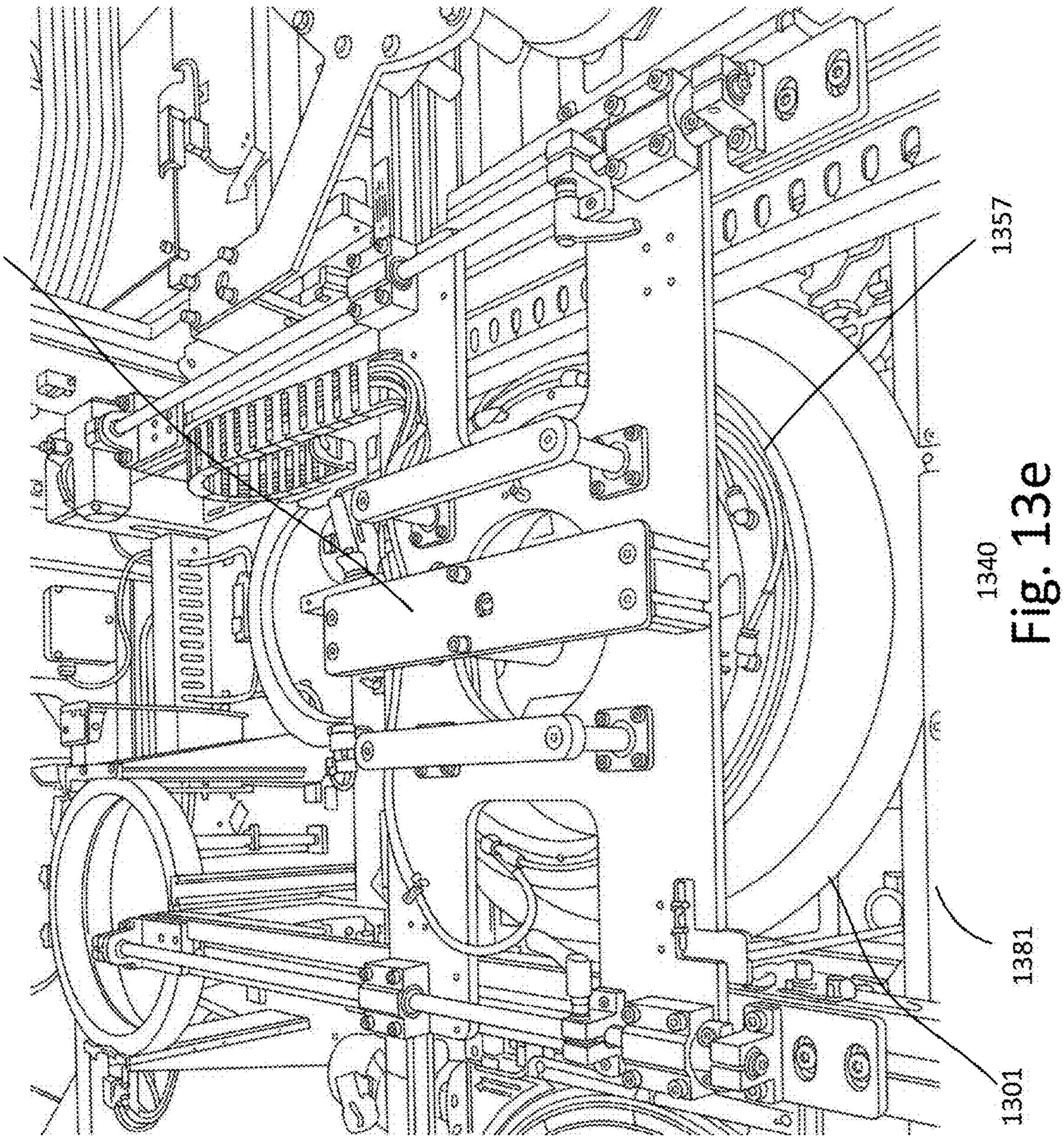

FIG. 13*e* illustrates positioning the wafer adaptor ring assembly 1301 from the position module onto the lamination chuck table. For example, the lamination assembly positioning unit 1381 positions the wafer adaptor ring assembly 1301 onto the lamination chuck table. Once in position, the lamination lock unit is engaged to lock the wafer adaptor ring assembly in position.

In one embodiment, the lamination head unit 1357 is lowered from the lamination head mount 1358 onto the wafer adaptor ring assembly. The laminator unit engages, pressing the lamination roller to the adhesive sheet under the adaptor wafer ring. The laminator unit rotates around an adaptor ring track which follows or tracks the adaptor wafer ring. The laminator unit is configured to smoothen out the adhesive sheet, laminating the adaptor wafer ring to the adhesive sheet. After lamination, the assembling of the wafer adaptor ring assembly is completed. The lamination head releases the laminated wafer adaptor ring assembly and is retracted. The lamination lock unit disengages, freeing the laminated wafer adaptor ring assembly.

Figure 14:
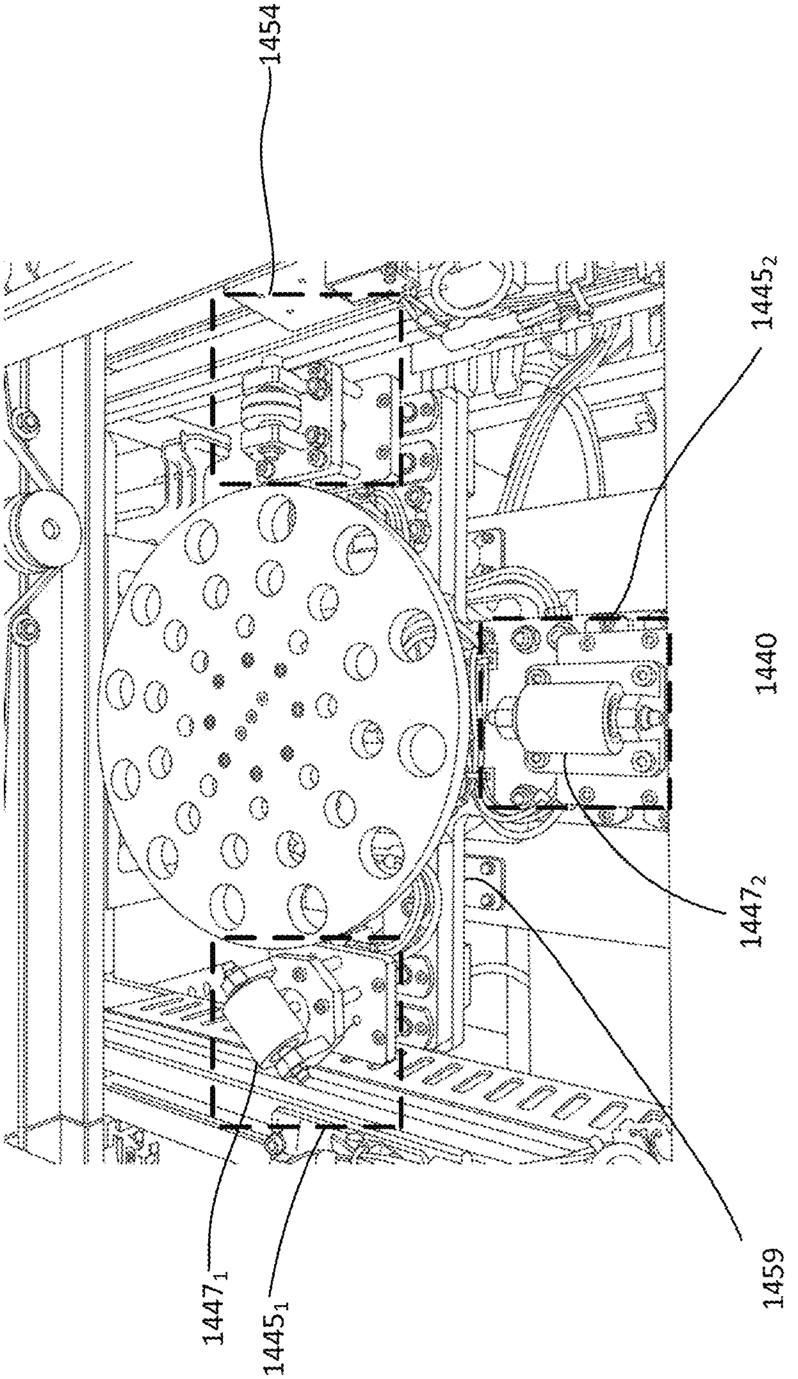
FIG. 14 shows an embodiment of a lamination and cutting module.

FIG. 14 shows an embodiment of a lamination module 1440 without the lamination head unit. As shown, the lamination module includes the lamination chuck table on which the wafer adaptor ring assembly is mounted. The lamination module includes a processing unit with a processing base 1459. The processing base includes a central portion and extension arms for accommodating different processing units. For example, the central portion is configured to rotate about an axis of rotation. The axis of rotation, in one embodiment, is perpendicular to the center of the lamination chuck table.

In one embodiment, the processing unit includes first and second extension arms for accommodating the laminator unit $1445_1$ and the cutter unit 1454. The lengths of the arms are sufficient to ensure the operation of the processing units. In the case of two extension arms, they are opposing extension arms to maintain rotational balance when the processing base is rotated. In one embodiment, the processing base further includes a third arm for accommodating a second laminator unit $1445_2$. As shown, the laminator or first laminator unit $1445_1$ includes an angled lamination roller $1447_1$ and the second laminator unit $1445_2$ includes a non-angled lamination roller. The gap between the first and second laminator units is about 90°. Other gaps may also be useful.

Figure 15A:
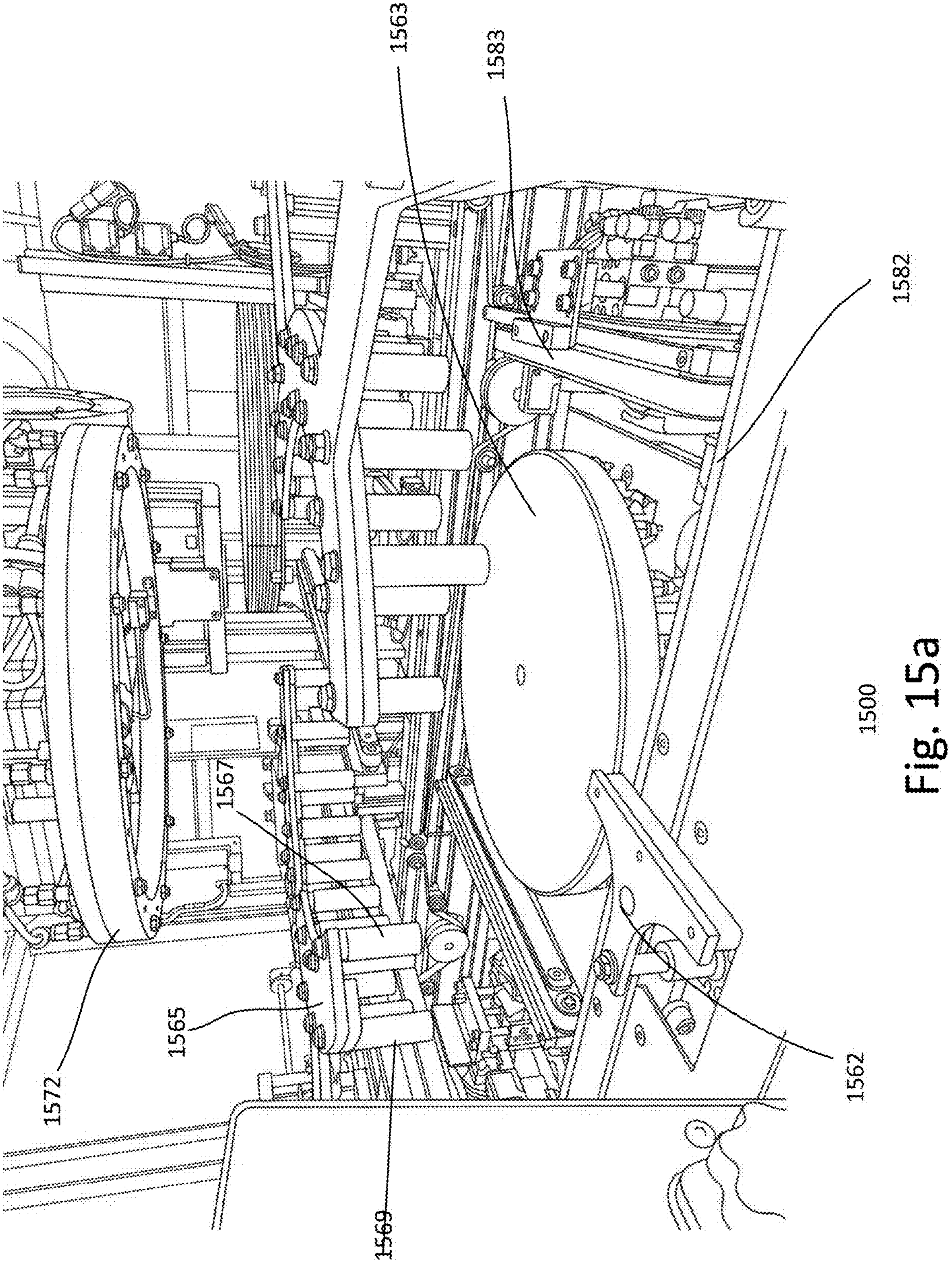
FIGS. 15*a*-15*e* show a process flow for separating an adaptor ring with the wafer from the primary wafer ring by an embodiment of a system for adapting a wafer for plasma dicing.

FIGS. 15*a*-15*e* show a process flow 1500 for separating an adaptor ring with the wafer from the primary wafer ring by a ring removal module of the system. Referring to FIG. 15*a*, the wafer ring removal module is shown. The ring removal module includes a ring removal positioning unit 1582, a ring removal head unit 1572, a ring removal chuck table unit 1563, a ring removal assembly lock unit 1562, a ring separator unit 1565 with primary ring separator posts 1569 and adhesive sheet posts 1567 and a primary ring removal output transfer unit 1583. Providing the ring removal module with other units may also be useful.

Figure 15B:
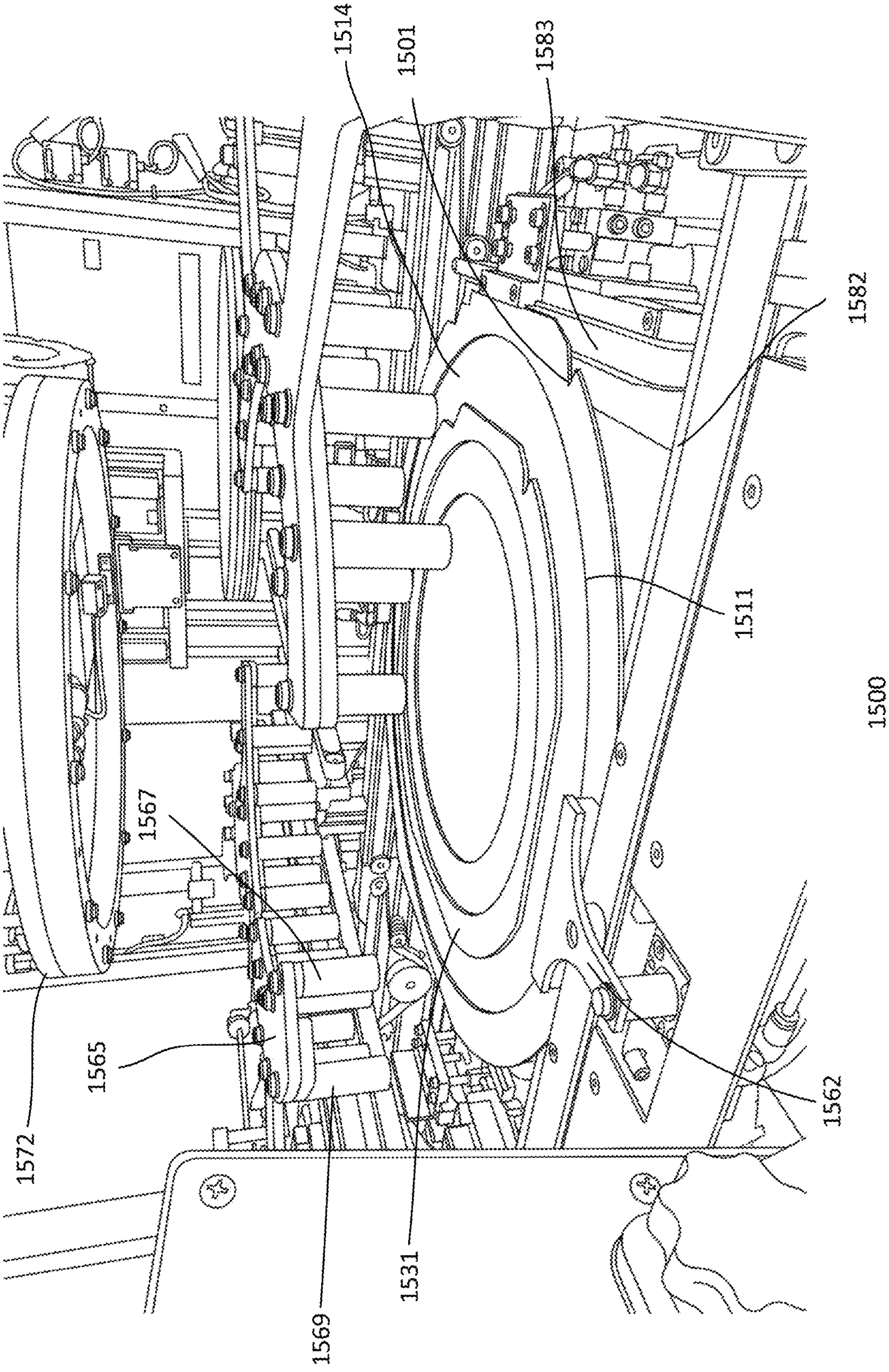

In FIG. 15*b*, a cut processed wafer adaptor ring assembly 1501 is positioned on the ring removal chuck table unit by the ring removal positioning unit. The chuck table has a table diameter which is smaller than the diameter of the inner edge of the primary ring 1511 but larger than the outer edge of the adaptor ring 1531. Once in position, the ring removal lock unit 1562 locks the cut processed wafer adaptor ring assembly in place.

Figure 15C:
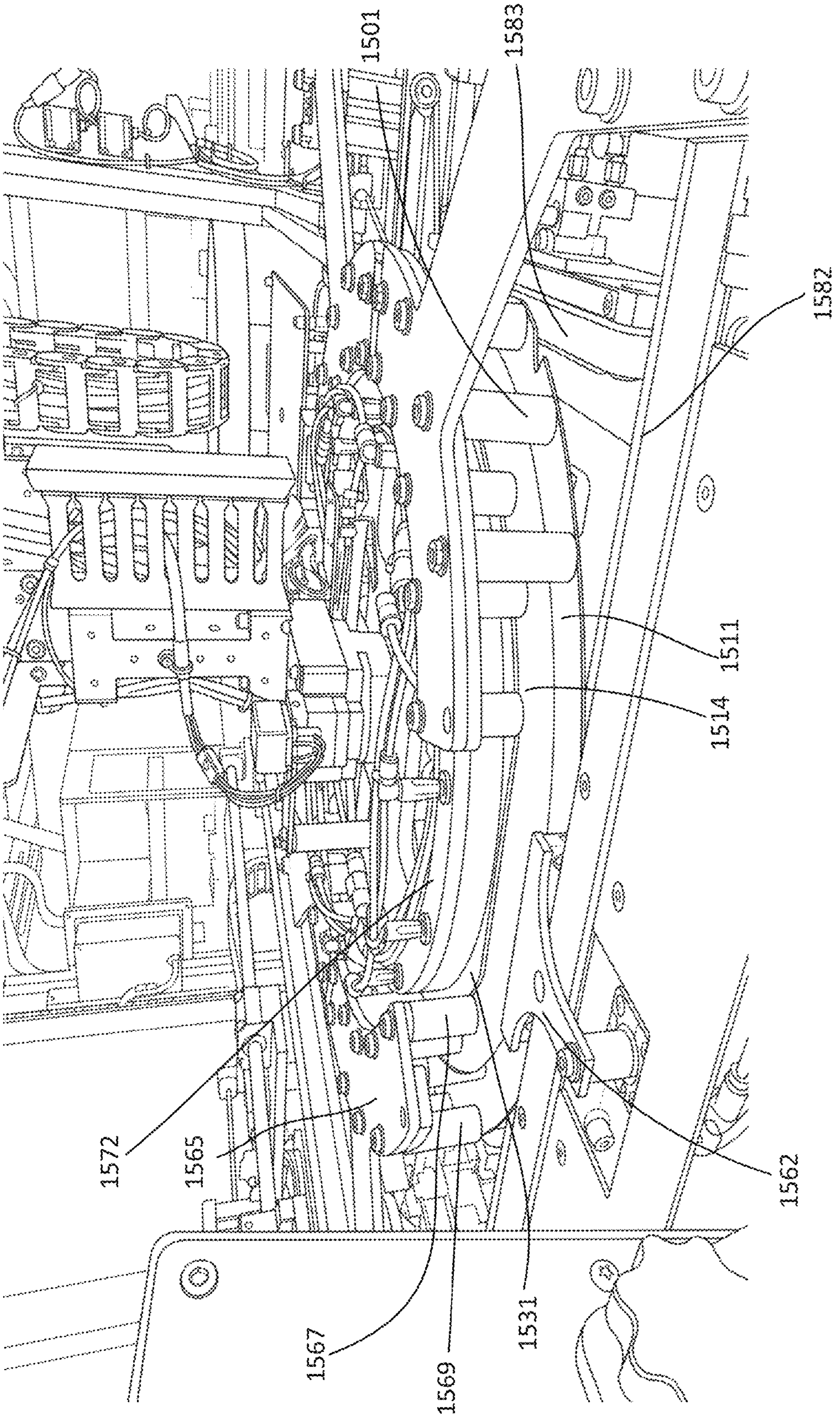

Referring to FIG. 15*c*, the ring separator unit 1565 is positioned on the wafer assembly. For example, the ring separator unit is lowered, causing the primary ring separator posts 1569 to press against the primary wafer ring and the adhesive sheet posts 1567 to press against the adhesive sheet between the primary wafer ring and adaptor wafer ring. The ring removal head unit is lowered onto the wafer adaptor ring assembly. In one embodiment, the removal head unit covers the adaptor ring assembly.

Figure 15D:
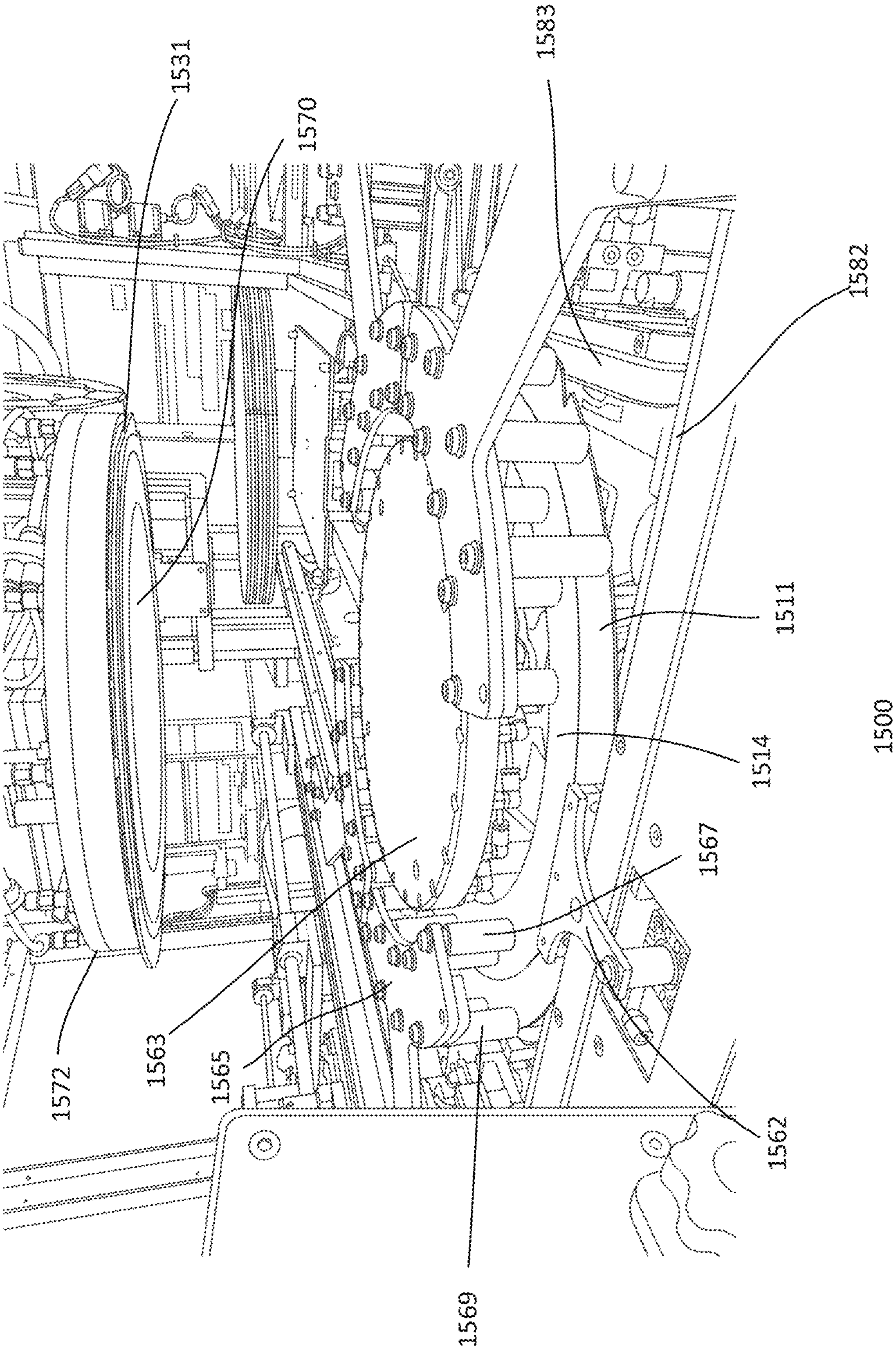
Figure 15E:
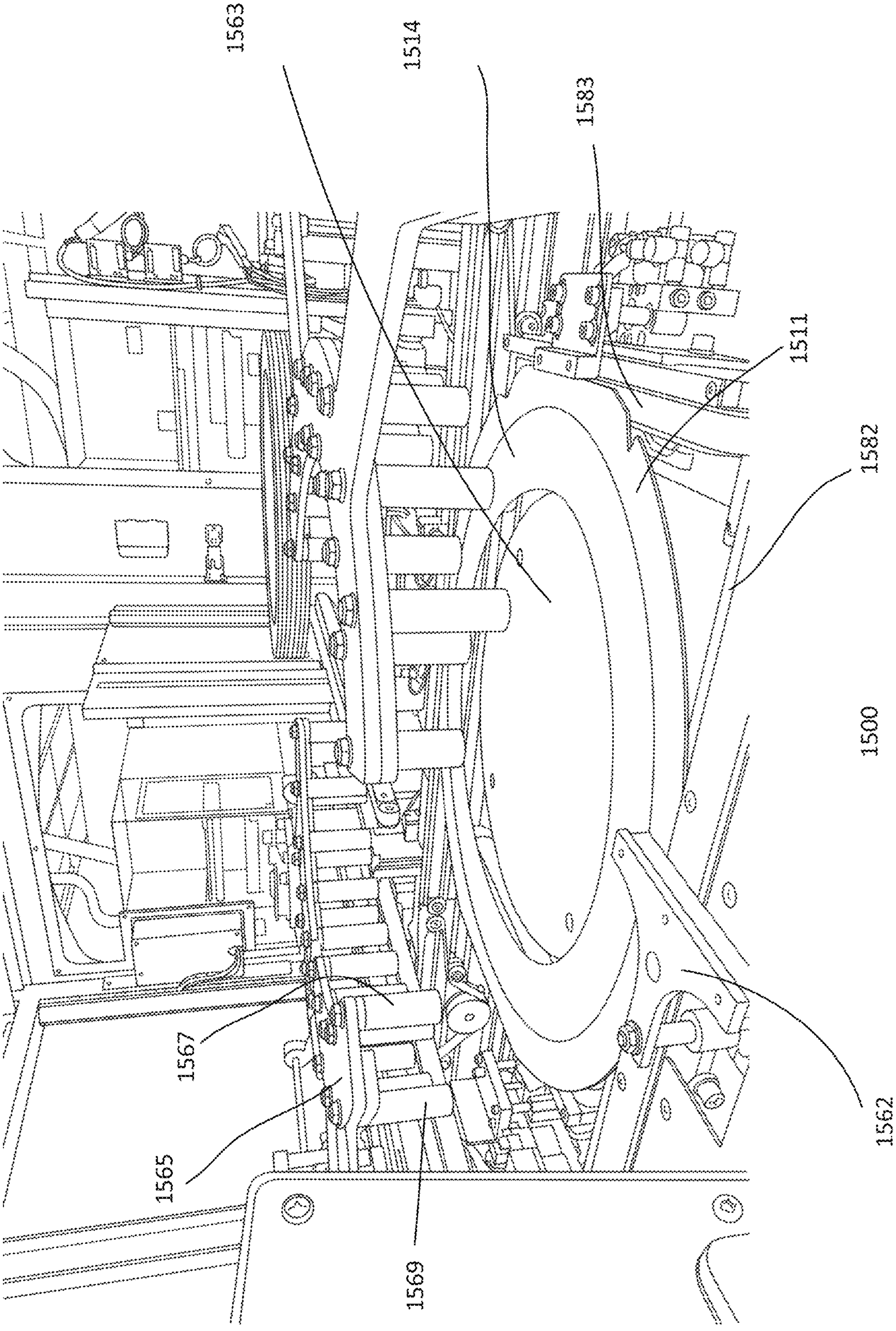

As shown in FIG. 15*d*, the ring removal chuck table unit 1563 is moved upwards along with the ring removal head unit 1572. This separates the adaptor ring assembly with the diced wafer 1570 and adaptor ring 1531 from the primary ring assembly with the 1511 and adhesive sheet 1514.

After separation, the ring removal chuck table 1563 is lowered below the primary ring and the ring separator unit 1565 is raised away from the primary ring assembly. The ring removal lock unit 1562 disengages, freeing the primary ring assembly with the cut adhesive sheet. The primary ring assembly is transferred to the primary ring repository. For example, the primary ring removal output transfer unit 1583 transfers the primary ring assembly to the primary ring repository. The primary ring removal output transfer unit, for example, includes first and second belts configured to transfer the primary ring assembly to the primary ring repository. The primary ring repository is configured to hold a stack of primary ring assemblies with the cut adhesive sheets. When the repository is full, the stack is transferred to remove the adhesive sheets, resulting in cleaned primary wafer rings for reuse.

As for the adaptor ring assembly, the ring removal head unit holds the adaptor ring assembly thereon and transfers it to the adaptor ring assembly output module. The ring removal head releases the adaptor ring assembly into the adaptor ring assembly output module. The adaptor ring assembly output module may store a stack of adaptor ring assemblies. When full, the stack of adaptor ring assemblies is transferred for subsequent processing, such as separating the dies of the diced wafer from the adhesive sheet and separating the adhesive sheet from the adaptor wafer ring, resulting in a clean adaptor ring for reuse.

Figure 16:
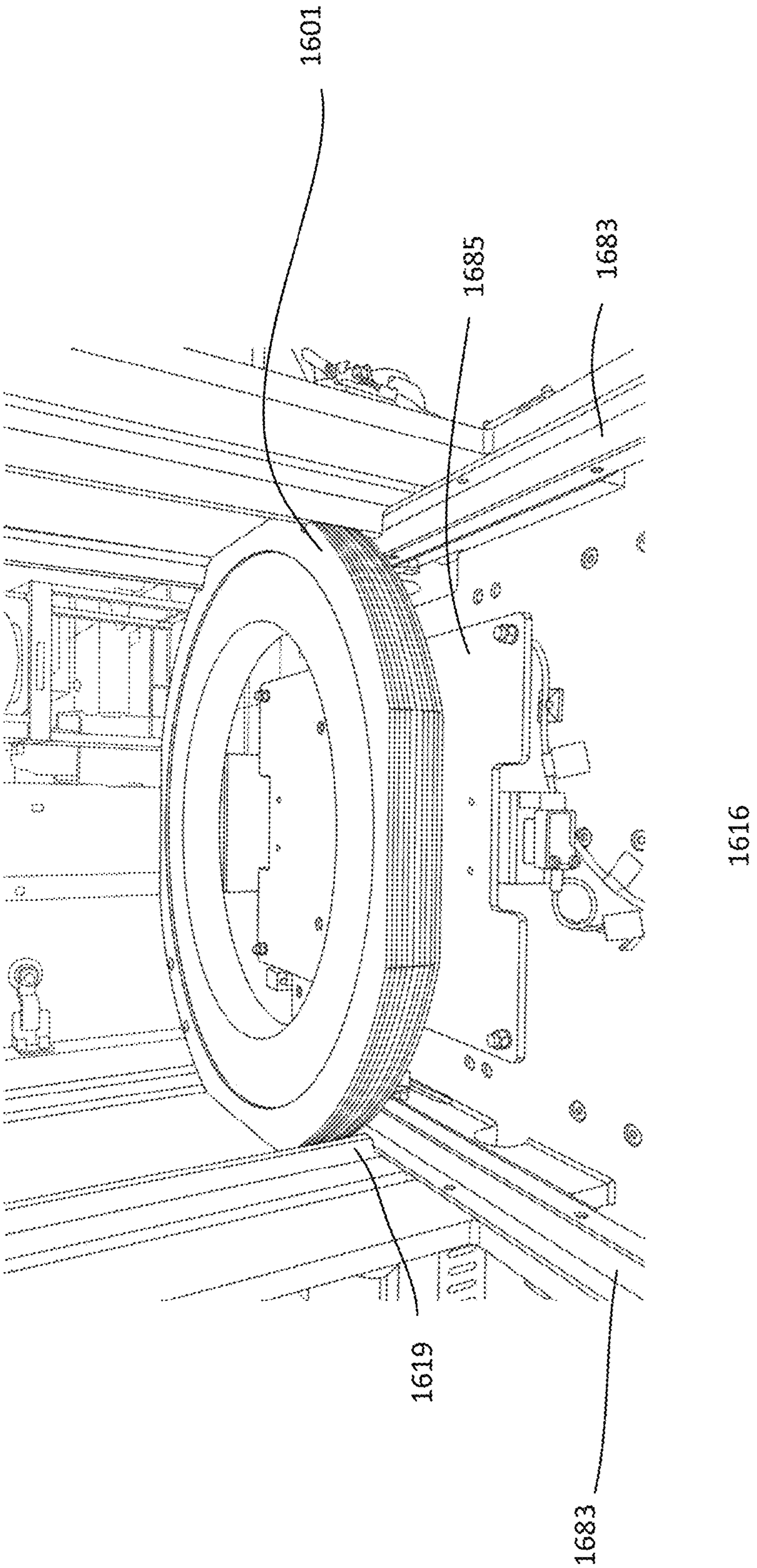
FIG. 16 shows an embodiment of a primary ring repository of an embodiment of a system for adapting a wafer for plasma dicing.

FIG. 16 shows an embodiment of a primary ring repository module 1616. The primary ring repository module stores a stack of separated primary rings 1601 after ring removal by the ring removal module. The ring repository module includes a stacker which holds the stack of primary rings. A retaining ring holder 1619 holds the rings of the stack in the stacker. When a new primary ring is to be stored in the primary ring removal module, the stacker raises the current stack of rings to allow the primary ring removal output transfer unit 1683 to move the separated primary ring from the ring removal module into position in the primary ring repository module. Once in position, a bottom base plate 1685 rises to bring the new primary ring together with the other rings held by the holder and lowers thereafter. The process is repeated until the primary ring removal module is full. The primary stack is removed, and a new stack is loaded one by one from the ring removal module.

After separation, the primary ring assembly is transferred to the primary ring repository. For example, the primary ring repository is configured to hold a stack of primary ring assemblies with the cut adhesive sheets. When the repository is full, the stack is transferred to remove the adhesive sheets, resulting in cleaned primary wafer rings for reuse.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A system for assembling a wafer adaptor ring assembly for processing of an adapted sized wafer in processes designed for processing of a designed size wafer which is larger than the adapted sized wafer, the system comprises:

an input subsystem for providing input materials for assembling the wafer adaptor ring assembly; the input subsystem comprises an adaptor wafer ring repository module configured to hold a stack of adaptor wafer rings, a primary wafer ring with wafer module configured with a supply of assembled primary ring assemblies with wafers, and a processed wafer adaptor ring assembly module configured with a stack of processed wafer adaptor ring assemblies;

a processing subsystem for assembling the input materials into the wafer adaptor ring assembly; and an output subsystem for outputting the wafer adaptor ring assembly for processing the adapted sized wafer.

2. The system of claim 1 wherein:

the adaptor wafer ring repository module provides an adaptor wafer ring as a first input material of the input materials for the processing subsystem;

the primary wafer ring with wafer module provides a primary wafer ring assembly as a second input material for the processing subsystem, the primary wafer ring assembly includes a primary wafer ring, an adhesive sheet attached to a bottom surface of the primary wafer ring, and the adapted sized wafer attached to the adhesive sheet within a primary wafer ring opening of the primary wafer ring; and the processed wafer adaptor ring assembly module provides a processed wafer adaptor ring assembly with a diced adapted sized wafer as a third input material of the input materials for the processing subsystem.

3. The system of claim 2 wherein the processing subsystem comprises:

a position module, the position module is configured to position the adaptor wafer ring from the adaptor wafer ring repository module on the primary wafer ring assembly from the primary wafer ring with wafer module to form the wafer adaptor ring assembly; and a lamination module for laminating the adaptor wafer ring to the adhesive sheet of the primary wafer ring assembly, wherein laminating the adaptor wafer ring smoothens the adhesive sheet under the adaptor wafer ring to improve adhesion, wherein the lamination module produces a laminated wafer adaptor ring assembly for dicing the adapted sized wafer by a plasma chamber.

4. The system of claim 3 wherein the output subsystem comprises a laminated wafer adaptor ring assembly output module for storing the laminated wafer adaptor ring assembly for plasma dicing.

5. The system of claim 2 wherein the processing subsystem comprises:

a cutting module, the cutting module is configured to cut the adhesive sheet of the processed wafer adaptor ring assembly under the adaptor wafer ring on the primary wafer ring; and a ring removal module for separating the primary wafer ring with a portion of the cut adhesive sheet from the processed wafer adaptor ring assembly having the adaptor wafer ring, a cut portion of the adhesive sheet within the adaptor wafer ring and the diced adapted sized wafer.

6. The system of claim 5 wherein the output subsystem comprises:

a primary wafer repository module for storing the primary wafer ring after separation; and an adaptor ring assembly output module for storing the processed wafer adaptor ring assembly.

7. The system of claim 2 wherein the processing subsystem comprises:

a position module, the position module is configured to position the adaptor wafer ring from the adaptor wafer ring repository module on the primary wafer ring assembly from the primary wafer ring with wafer module to form the wafer adaptor ring assembly;

a lamination module for laminating the adaptor wafer ring to the adhesive sheet of the primary wafer ring assembly, wherein laminating the adaptor wafer ring smoothens the adhesive sheet under the adaptor wafer ring to improve adhesion, wherein the lamination module produces a laminated wafer adaptor ring assembly for dicing the adapted sized wafer by a plasma chamber;

a cutting module for cutting the processed wafer adaptor ring assembly with the diced adapted sized wafer to form a cut processed wafer adaptor ring assembly; and a ring removal module for separating the primary wafer ring with a portion of the cut adhesive sheet from the processed wafer adaptor ring assembly having the adaptor wafer ring, a cut portion of the adhesive sheet within the adaptor wafer ring and the diced adapted sized wafer.

8. The system of claim 7 wherein the cutting module is integrated into the lamination module.

9. A system for assembling a wafer adaptor ring assembly for processing of an adapted sized wafer in processes designed for processing of a designed size wafer which is larger than the adapted sized wafer, the system comprises:

an input subsystem for providing 3 input materials for assembling the wafer adaptor ring assembly, the input subsystem comprises an adaptor wafer ring depository module, the adaptor wafer ring repository module provides an adaptor wafer ring as a first input material of the 3 input materials, a primary wafer ring with wafer module, the primary wafer ring with wafer module provides a primary wafer ring assembly as a second input material of the 3 input materials, the primary wafer ring assembly includes a primary wafer ring, an adhesive sheet attached to a bottom surface of the primary wafer ring, and the adapted sized wafer attached to the adhesive sheet within a primary wafer ring opening of the primary wafer ring, and a processed wafer adaptor ring assembly module, the processed wafer adaptor ring assembly module provides a processed wafer adaptor ring assembly with a diced adapted sized wafer as a third input material of the 3 input materials;

a processing subsystem for assembling the 3 input materials into the wafer adaptor ring assembly; and an output subsystem for outputting the wafer adaptor ring assembly for processing the adapted sized wafer.

10. The system of claim 9 wherein the processing subsystem comprises:

a position module, the position module is configured to position the adaptor wafer ring from the adaptor wafer ring repository module on the primary wafer ring assembly from the primary wafer ring with wafer module to form the wafer adaptor ring assembly; and a lamination module for laminating the adaptor wafer ring to the adhesive sheet of the primary wafer ring assembly, wherein laminating the adaptor wafer ring smoothens the adhesive sheet under the adaptor wafer ring to improve adhesion, wherein the lamination module produces a laminated wafer adaptor ring assembly for dicing the adapted sized wafer by a plasma chamber.

11. The system of claim 10 wherein the output subsystem comprises a laminated wafer ring adaptor assembly output module for storing the laminated wafer adaptor ring assembly for plasma dicing.

12. The system of claim 9 wherein the processing subsystem comprises:

a cutting module, the cutting module is configured to cut the adhesive sheet of the processed wafer adaptor ring assembly under the adaptor wafer ring on the primary wafer ring; and a ring removal module for separating the primary wafer ring with a portion of the cut adhesive sheet from the processed wafer adaptor ring assembly having the adaptor wafer ring, a cut portion of the adhesive sheet within the adaptor wafer ring and the diced adapted sized wafer.

13. The system of claim 12 wherein the output subsystem comprises:

a primary wafer repository module for storing the primary wafer ring after separation; and an adaptor ring assembly output module for storing the processed wafer adaptor ring assembly.

14. The system of claim 9 wherein the processing subsystem comprises:

a position module, the position module is configured to position the adaptor wafer ring from the adaptor wafer ring repository module on the primary wafer ring assembly from the primary wafer ring with wafer module to form the wafer adaptor ring assembly;

a lamination module for laminating the adaptor wafer ring to the adhesive sheet of the primary wafer ring assembly, wherein laminating the adaptor wafer ring smoothens the adhesive sheet under the adaptor wafer ring to improve adhesion, wherein the lamination module produces a laminated wafer adaptor ring assembly for dicing the adapted sized wafer by a plasma chamber;

a cutting module for cutting the processed wafer adaptor ring assembly with the diced adapted sized wafer to form a cut processed wafer adaptor ring assembly; and a ring removal module for separating the primary wafer ring with a portion of the cut adhesive sheet from the processed wafer adaptor ring assembly having the adaptor wafer ring, a cut portion of the adhesive sheet within the adaptor wafer ring and the diced adapted sized wafer.

15. The system of claim 14 wherein the cutting module is integrated into the lamination module.

* * * * *